United States Patent
Chou et al.

(10) Patent No.: US 10,332,789 B2
(45) Date of Patent: Jun. 25, 2019

(54) SEMICONDUCTOR DEVICE WITH TIN ADHESION LAYER FOR FORMING A CONTACT PLUG

(71) Applicant: Taiwan Semiconductor Manufacturing Co., Ltd., Hsinchu (TW)

(72) Inventors: Tien-Pei Chou, Taichung (TW); Ken-Yu Chang, Hsinchu (TW); Chun-Chieh Wang, Kaohsiung (TW); Yueh-Ching Pai, Taichung (TW); Yu-Ting Lin, Tainan (TW); Yu-Wen Cheng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/887,819

(22) Filed: Feb. 2, 2018

(65) Prior Publication Data
US 2019/0164822 A1 May 30, 2019

Related U.S. Application Data

(60) Provisional application No. 62/590,742, filed on Nov. 27, 2017.

(51) Int. Cl.
*H01L 21/768* (2006.01)
*H01L 21/285* (2006.01)
(Continued)

(52) U.S. Cl.
CPC ........ *H01L 21/76846* (2013.01); *C23C 16/02* (2013.01); *C23C 16/0227* (2013.01);
(Continued)

(58) Field of Classification Search
CPC ....... H01L 21/76846–76852; H01L 29/41791; H01L 21/76802–76817;
(Continued)

(56) References Cited

U.S. PATENT DOCUMENTS

| | | | |
|---|---|---|---|
| 6,982,226 B1 * | 1/2006 | Merchant | H01L 21/7684 257/E21.583 |
| 9,105,490 B2 | 8/2015 | Nang et al. | |

(Continued)

*Primary Examiner* — Selim U Ahmed
*Assistant Examiner* — Evan G Clinton
(74) *Attorney, Agent, or Firm* — Slater Matsil, LLP

(57) ABSTRACT

The present disclosure relates generally to techniques for forming a continuous adhesion layer for a contact plug. A method includes forming an opening through a dielectric layer to an active area on a substrate. The method includes performing a first plasma treatment along a sidewall of the opening. The method includes performing an atomic layer deposition (ALD) process to form a metal nitride layer along the sidewall of the opening. The ALD process includes a plurality of cycles. Each cycle includes flowing a precursor to form a metal monolayer along the sidewall and performing a second plasma treatment to treat the metal monolayer with nitrogen. The method includes depositing a conductive material on the metal nitride layer in the opening to form a conductive feature.

20 Claims, 22 Drawing Sheets

(51) Int. Cl.
*H01L 23/532* (2006.01)
*H01L 29/78* (2006.01)
*H01L 23/522* (2006.01)
*H01L 21/8234* (2006.01)
*H01L 29/417* (2006.01)
*C23C 16/02* (2006.01)
*C23C 16/455* (2006.01)

(52) U.S. Cl.
CPC .. *C23C 16/45536* (2013.01); *H01L 21/28518* (2013.01); *H01L 21/76804* (2013.01); *H01L 21/823431* (2013.01); *H01L 23/5226* (2013.01); *H01L 23/53209* (2013.01); *H01L 29/41791* (2013.01); *H01L 29/785* (2013.01); *C23C 16/0209* (2013.01); *H01L 2029/7858* (2013.01)

(58) Field of Classification Search
CPC .................. H01L 21/76877–76883; C23C 16/45536–45542; C23C 16/02
See application file for complete search history.

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,786,603 B1* | 10/2017 | Clevenger | H01L 23/5226 |
| 9,831,183 B2 | 11/2017 | Lin et al. | |
| 9,859,386 B2 | 1/2018 | Ho et al. | |
| 2010/0090342 A1* | 4/2010 | Chang | H01L 21/76844 257/751 |
| 2015/0279681 A1* | 10/2015 | Knoops | C23C 16/52 438/765 |
| 2016/0043035 A1* | 2/2016 | Lin | H01L 21/76802 257/751 |
| 2017/0022612 A1* | 1/2017 | Lei | C23C 16/455 |
| 2017/0243827 A1* | 8/2017 | Simon | H01L 23/53238 |
| 2018/0076032 A1* | 3/2018 | Wang | C23C 16/342 |
| 2018/0090495 A1* | 3/2018 | Lee | H01L 27/0924 |

* cited by examiner

SEMICONDUCTOR DEVICE WITH TIN ADHESION LAYER FOR FORMING A CONTACT PLUG

CROSS-REFERENCE TO RELATED APPLICATION & PRIORITY CLAIM

This application claims benefit of and priority to U.S. Provisional Patent Application Ser. No. 62/590,742, filed Nov. 27, 2017, which is herein incorporated by reference in its entirety for all applicable purposes.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
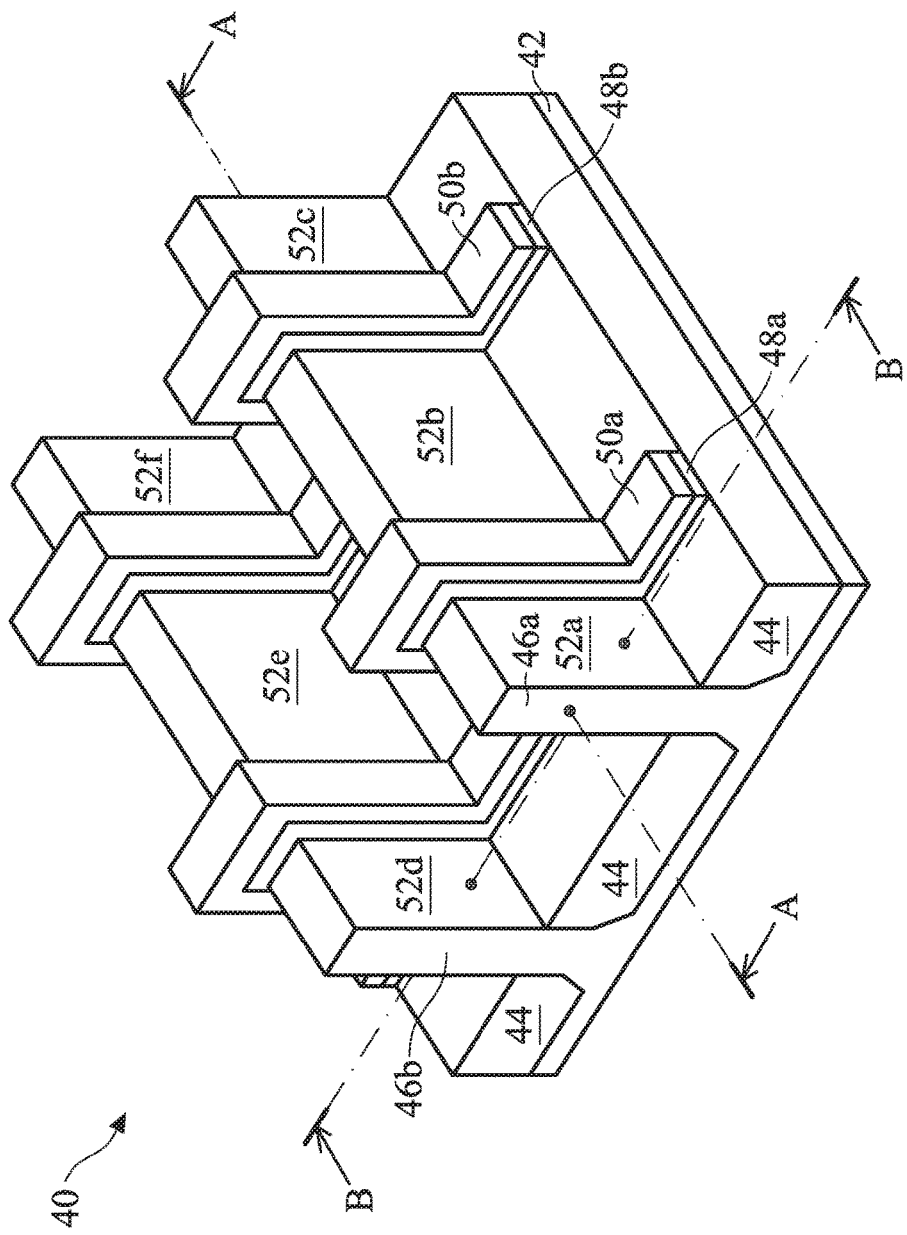
FIG. 1 is a three-dimensional view of an example of simplified Fin Field-Effect Transistors (FinFETs) in in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, and methods for forming those conductive features. In some examples, a contact plug is formed. Some example processes for forming the contact plug involve performing a pretreatment comprising a nitrogen plasma, forming a conformal (e.g., continuous) adhesion layer such a Titanium Nitride (TiN) adhesion layer, and depositing a contact plug fill material, such as Cobalt (Co) with few Co void defects and low contact resistance.

Example techniques for forming the continuous TiN adhesion layer and contact plug are described and illustrated herein with respect to Fin Field-Effect Transistors (FinFETs); however, formation of a contact plug within the scope of this disclosure may also be implemented in planar transistors and/or other semiconductor devices. Some examples are for a 14 nm contact hole in an N5 or N7 node. Further, intermediate stages of forming FinFETs are illustrated. Some aspects described herein are described in the context of FinFETs formed using a replacement gate process. In other examples, a gate-first process may be used. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

Example embodiments described herein are described in the context of forming conductive features in Front End Of the Line (FEOL) and/or Middle End Of the Line (MEOL) processing for transistors. Implementations of some aspects of the present disclosure may be used in other processes, such as Back End Of the Line (BEOL) processing, and/or in other devices. Some variations of the example methods and structures are described. A person having ordinary skill in the art will readily understand other modifications that may be made that are contemplated within the scope of other embodiments. In some figures, some reference numbers of components or features illustrated therein may be omitted to avoid obscuring other components or features; this is for ease of depicting the figures.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as four transistors.

The FinFETs 40 comprise fins 46a and 46b on a substrate 42. The substrate 42 includes isolation regions 44, and the fins 46a and 46b each protrude above and from between neighboring isolation regions 44. Gate dielectrics 48a and 48b are along sidewalls and over top surfaces of the fins 46a and 46b, and gate electrodes 50a and 50b are over the gate dielectrics 48a and 48b, respectively. Source/drain regions 52a-f are disposed in respective regions of the fins 46a and 46b. Source/drain regions 52a and 52b are disposed in opposing regions of the fin 46a with respect to the gate dielectric 48a and gate electrode 50a. Source/drain regions 52b and 52c are disposed in opposing regions of the fin 46a with respect to the gate dielectric 48b and gate electrode 50b. Source/drain regions 52d and 52e are disposed in opposing regions of the fin 46b with respect to the gate dielectric 48a and gate electrode 50a. Source/drain regions 52e and 52f are disposed in opposing regions of the fin 46b with respect to the gate dielectric 48b and gate electrode 50b.

FIG. 1 further illustrates reference cross-sections that are used in later figures. Cross-section A-A is in a plane along, e.g., channels in the fin 46a between opposing source/drain regions 52a-c. Cross-section B-B is in a plane perpendicular to cross-section A-A and is across source/drain region 52a in fin 46a and across source/drain region 52d in fin 46b. Subsequent figures refer to these reference cross-sections for clarity.

FIGS. 2A-B through 13A-B and 15A-B through 21A-B are cross-sectional views of intermediate stages in example processes of forming one or more FinFETs in accordance with some embodiments. In FIGS. 2A-B through 13A-B and 15A-B through 21A-B, figures ending with an "A" designation illustrate cross-sectional views along a cross-section similar to cross-section A-A in FIG. 1, and figures ending with a "B" designation illustrate cross-sectional views along a cross-section similar to cross-section B-B in FIG. 1.

FIGS. 2A-B through 13A-B and 15A-B through 17A-B are cross-sectional views of respective intermediate structures at intermediate stages in an example process of forming a semiconductor device in accordance with some embodiments. Aspects of FIGS. 2A-B through 9A-B are applicable to a gate-first process and to a replacement gate process as described herein. FIGS. 10A-B through 13A-B and 15A-B through 17A-B illustrate further aspects of a gate-first process as described herein. FIGS. 18A-B through 21A-B illustrate further aspects of a replacement gate process as described herein.

Figure 2A:
FIGS. 2A-B, 3A-B, 4A-B, 5A-B, 6A-B, 7A-B, 8A-B, 9A-B, 10A-B, 11A-B, 12A-B, and 13A-B are cross-sectional views of intermediate stages in an example process of forming one or more FinFETs in accordance with some embodiments.
Figure 2B:
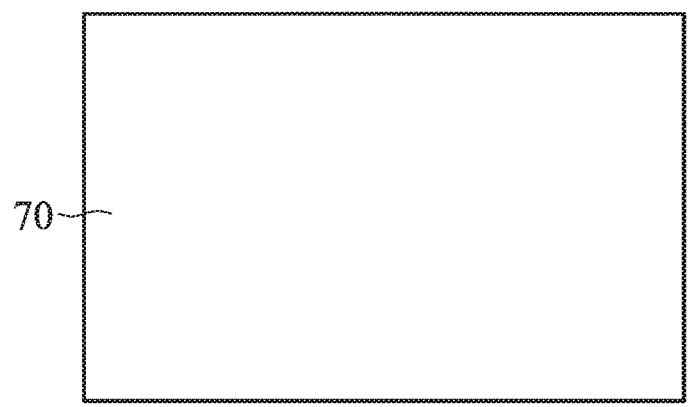

FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some aspects, the semiconductor material of the semiconductor substrate may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3A:
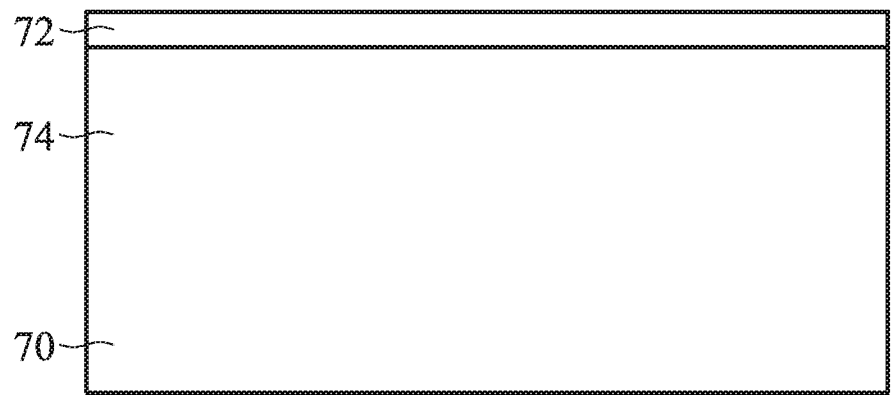
Figure 3B:
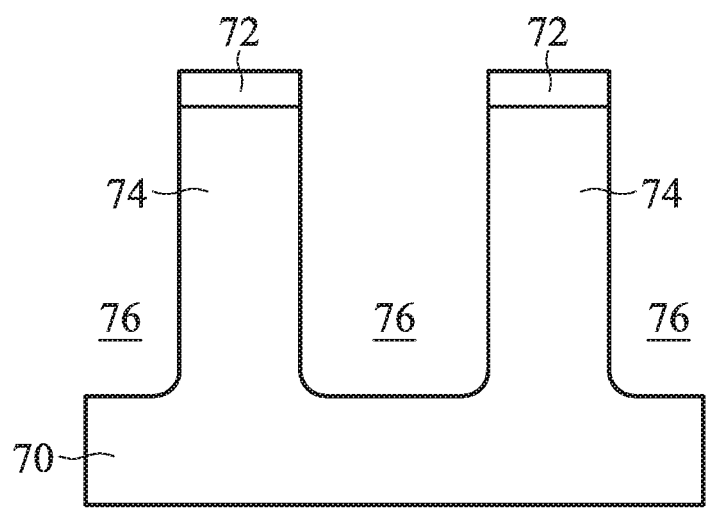

FIGS. 3A and 3B illustrate the formation of fins 74 in the semiconductor substrate 70. In the illustrated example, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, the like, or a combination thereof. The etching may be anisotropic.

Figure 4A:
Figure 4B:
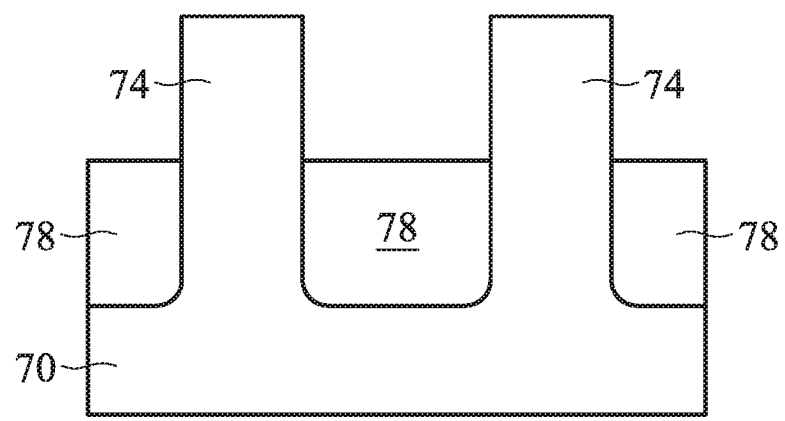

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a chemical mechanical polish (CMP), may remove any excess insulating material and any remaining mask 72 to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etching process, such as one that is selective to the material of the insulating material. For example, a wet or dry etch may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the process described with respect to FIGS. 2A-B through 4A-B is just one example of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating layer), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device. In various embodiments, the fins 74 may comprise silicon, silicon germanium ($Si_xGe_{1-x}$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like.

Figure 5A:
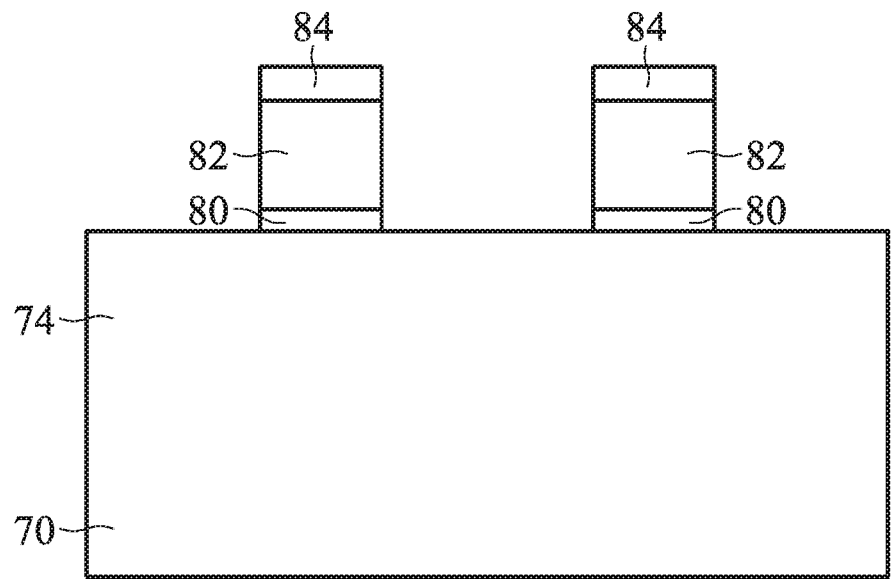
Figure 5B:
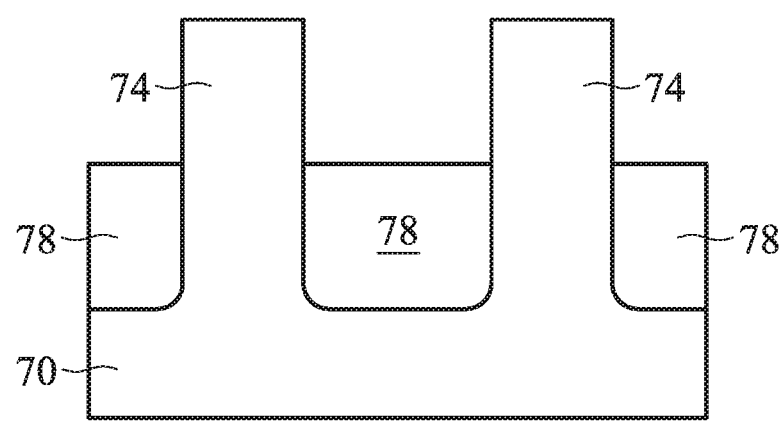

FIGS. 5A and 5B illustrate the formation of dummy gate stacks on the fins 74. Each dummy gate stack comprises an interfacial dielectric 80, a dummy gate 82, and a mask 84. The interfacial dielectric 80, dummy gate 82, and mask 84 may be formed by sequentially depositing respective layers and patterning those layers. For example, a layer for the interfacial dielectric 80 may include or be silicon oxide, silicon nitride, the like, or multilayers thereof, and may be thermally grown or deposited, such as by plasma-enhanced CVD (PECVD), ALD, or another deposition technique. A layer for the dummy gate 82 may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gate 82, and interfacial dielectric 80 may then be patterned, for example, using photolithography and one or more etch processes, like described above with respect to FIGS. 3A and 3B, to form the mask 84, dummy gate 82, and interfacial dielectric 80 for each gate stack.

In the illustrated example, a dummy gate stack is implemented for a replacement gate process. In other examples, a gate-first process may be implemented using gate stacks including, for example, a gate dielectric in the place of the interfacial dielectric 80, and a gate electrode in the place of the dummy gate 82. In some gate-first processes, the gate stack may be formed using similar processes and materials as described with respect to the dummy gate stacks; although in other examples, other processes or materials may be implemented. For example, a gate dielectric may include or be a high-k dielectric material, such as having a k value greater than about 7.0, which may include a metal oxide or silicate of Hf, Al, Zr, La, Mg, Ba, Ti, Pb, multilayers thereof, or a combination thereof. A gate dielectric may also be deposited by molecular-beam deposition (MBD), ALD, PECVD, or another deposition technique. A gate electrode may also include or be a metal-containing material such as TiN, TaN, TaC, Co, Ru, Al, multi-layers thereof, or a combination thereof.

Figure 6A:
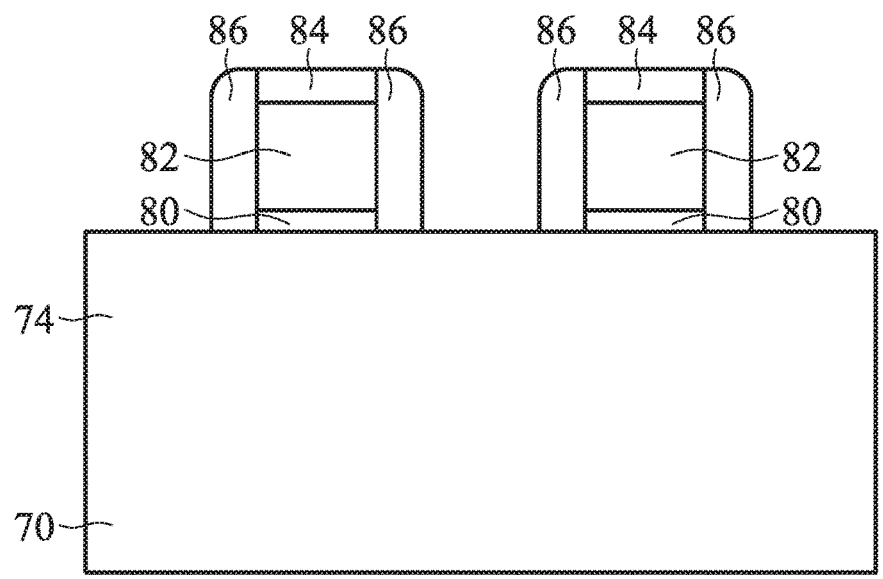
Figure 6B:
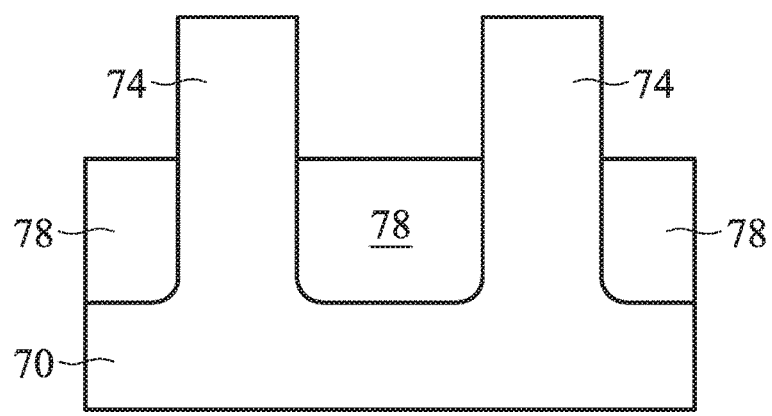

FIGS. 6A and 6B illustrate the formation of gate spacers 86. Gate spacers 86 are formed along sidewalls of the dummy gate stacks (e.g., sidewalls of the interfacial dielectric 80, dummy gate 82, and mask 84). The gate spacers 86 may be formed by conformally depositing one or more layers for the gate spacers 86 and anisotropically etching the one or more layers, for example. The one or more layers for the gate spacers 86 may include or be silicon nitride, silicon oxynitride, silicon carbon nitride, the like, multi-layers thereof, or a combination thereof, and the etch process can include a RIE, NBE, or another etching process.

Figure 7A:
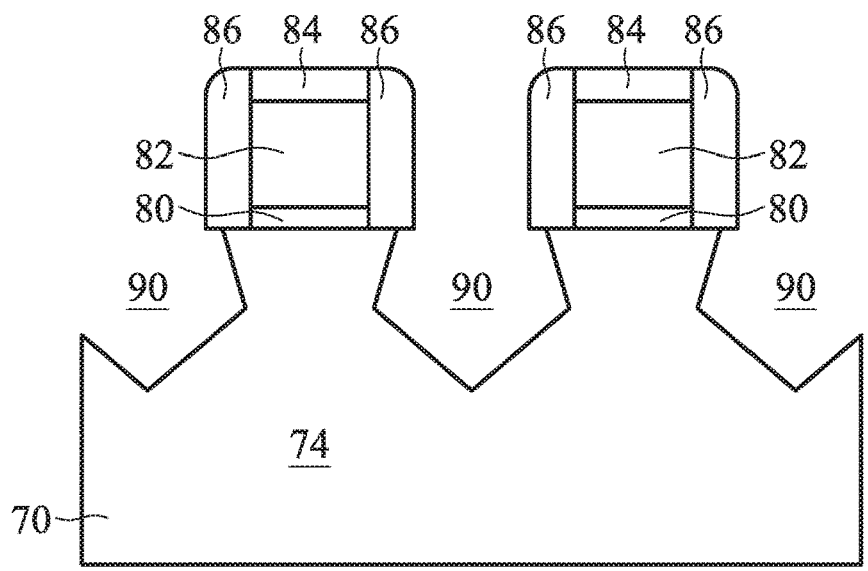
Figure 7B:
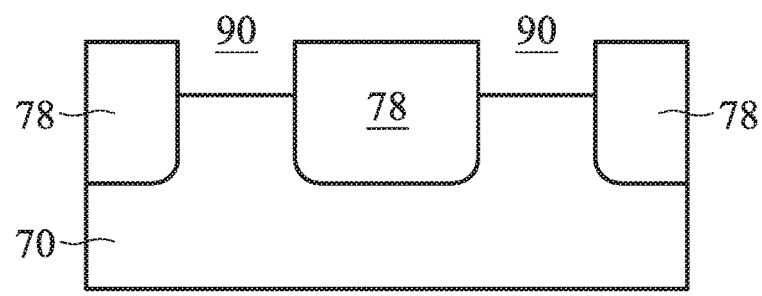

FIGS. 7A and 7B illustrate the formation of recesses 90 for source/drain regions. As illustrated, the recesses 90 are formed in the fins 74 on opposing sides of the dummy gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethyalammonium hydroxide (TMAH), ammonium hydroxide ($NH_4OH$), or another etchant.

Figure 8A:
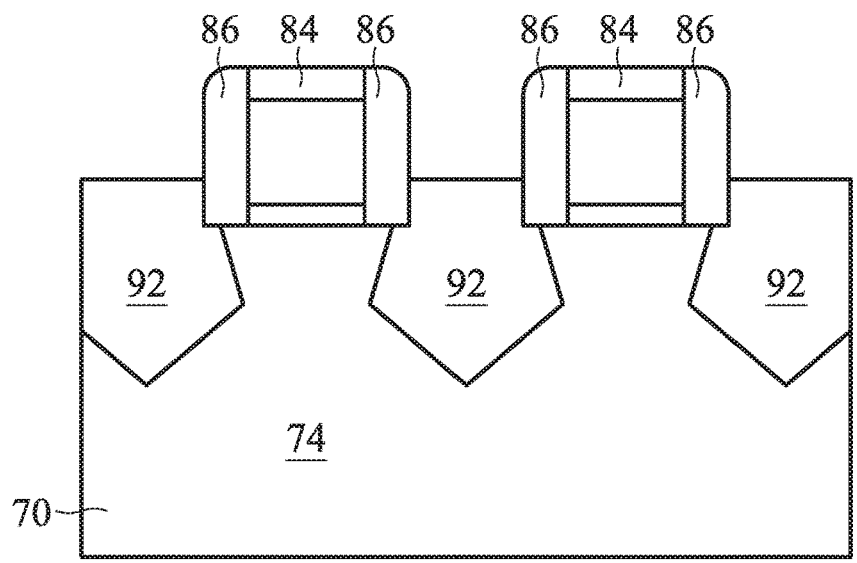
Figure 8B:
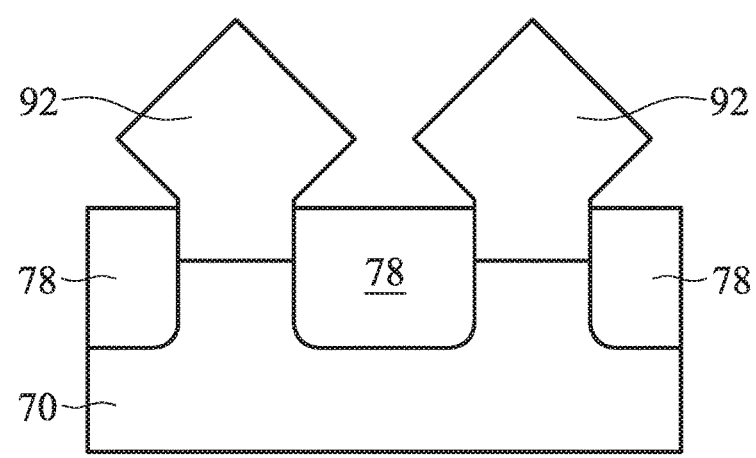

FIGS. 8A and 8B illustrate the formation of epitaxy source/drain regions 92 in the recesses 90. The epitaxy source/drain regions 92 may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-B and 8A-B may be omitted, and that source/drain regions may be formed by implanting dopants into the fins 74. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 9A:
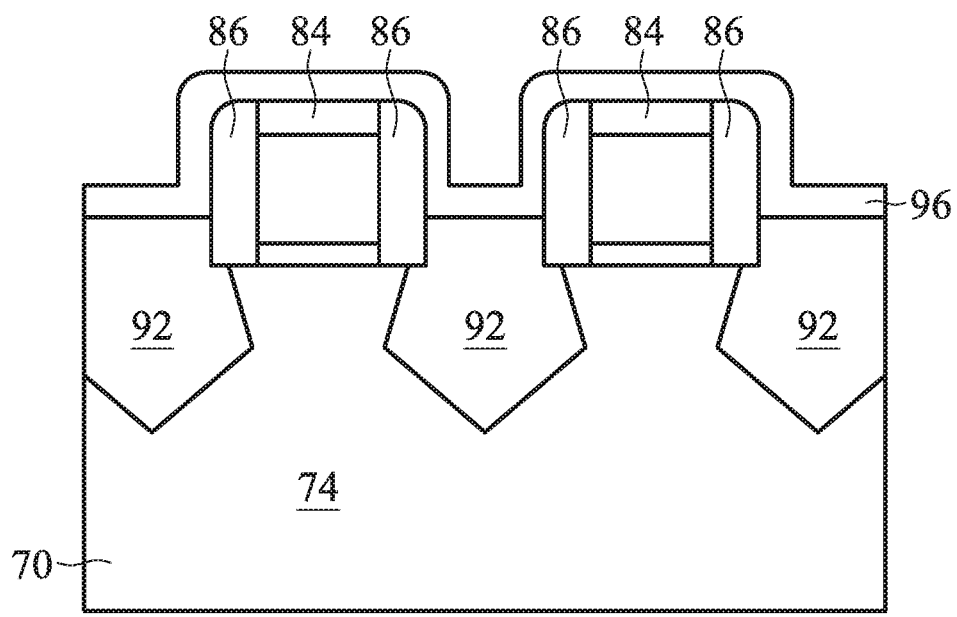
Figure 9B:
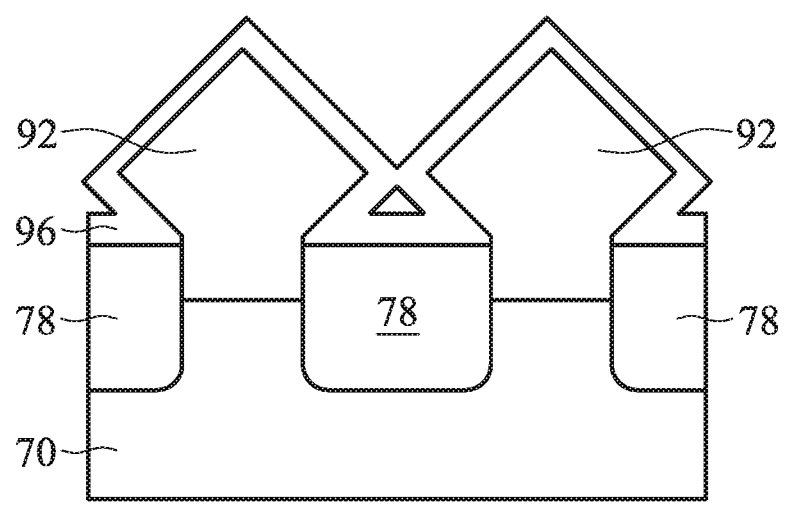

FIGS. 9A and 9B illustrate the formation of a contact etch stop layer (CESL) 96. Generally, an etch stop layer can provide a mechanism to stop an etch process when forming, e.g., contacts or vias. An etch stop layer may be formed of a dielectric material having a different etch selectivity from adjacent layers or components. The CESL 96 is conformally deposited on surfaces of the epitaxy source/drain regions 92, sidewalls and top surfaces of the gate spacers 86, top surfaces of the mask 84, and top surfaces of the isolation regions 78. The CESL 96 may comprise or be silicon nitride, silicon carbon nitride, silicon carbon oxide, carbon nitride, the like, or a combination thereof, and may be deposited by CVD, PECVD, ALD, or another deposition technique.

Figure 10A:
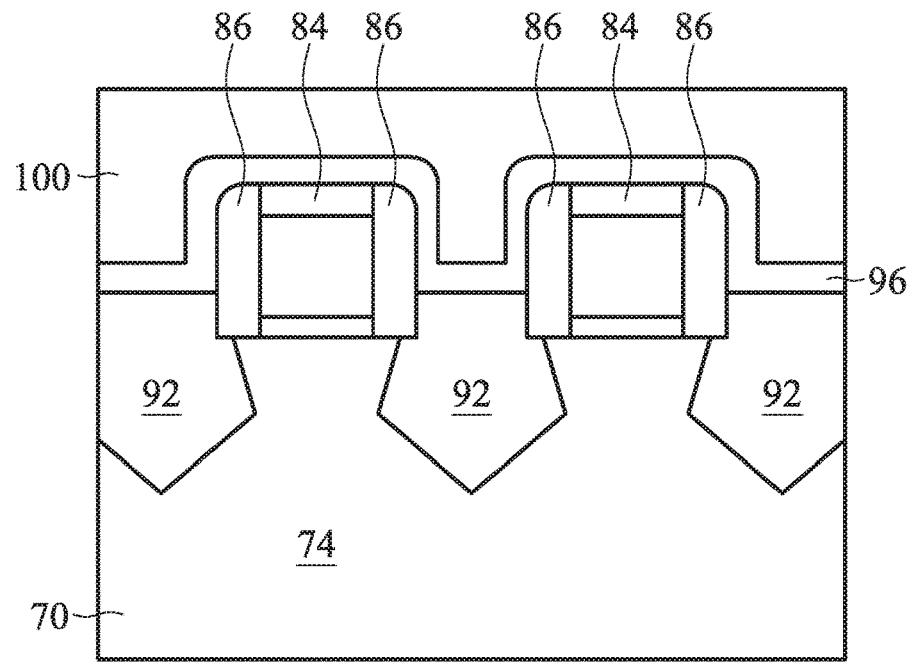
Figure 10B:
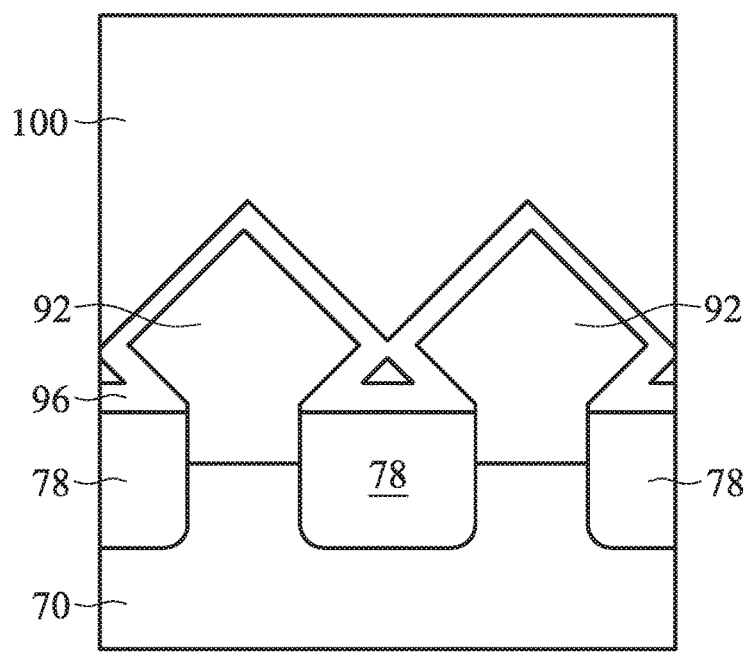

FIGS. 10A and 10B illustrate the formation of a first interlayer dielectric (ILD) 100 over the CESL 96. The first ILD 100 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The first ILD 100 may be planarized after being deposited, such as by a CMP. In a gate-first process, a top surface of the first ILD 100 may be above the upper portions of the CESL 96 and the gate stacks. Hence, the upper portions of the CESL 96 may remain over the gate stacks.

Figure 11A:
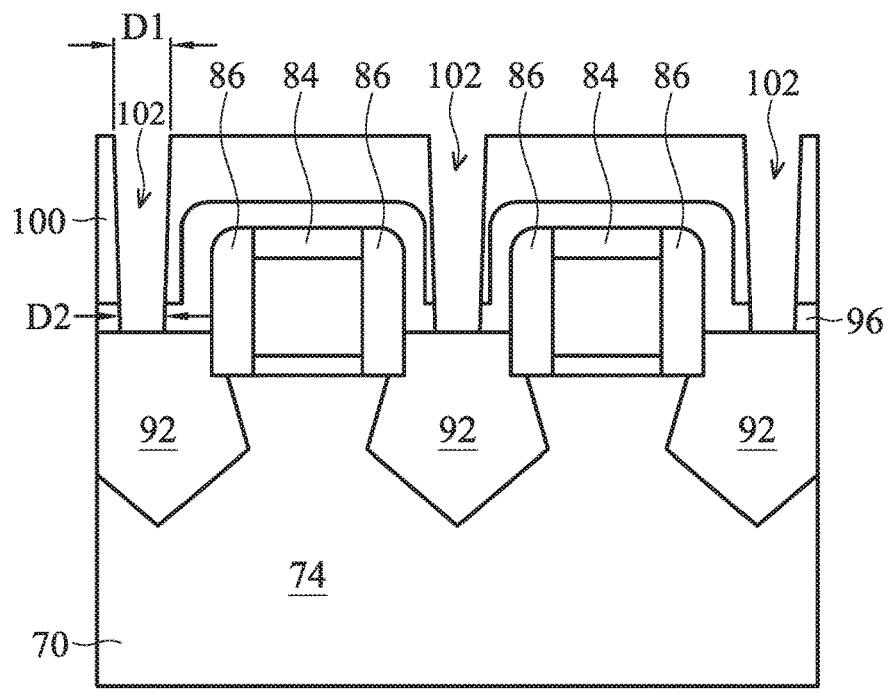
Figure 11B:
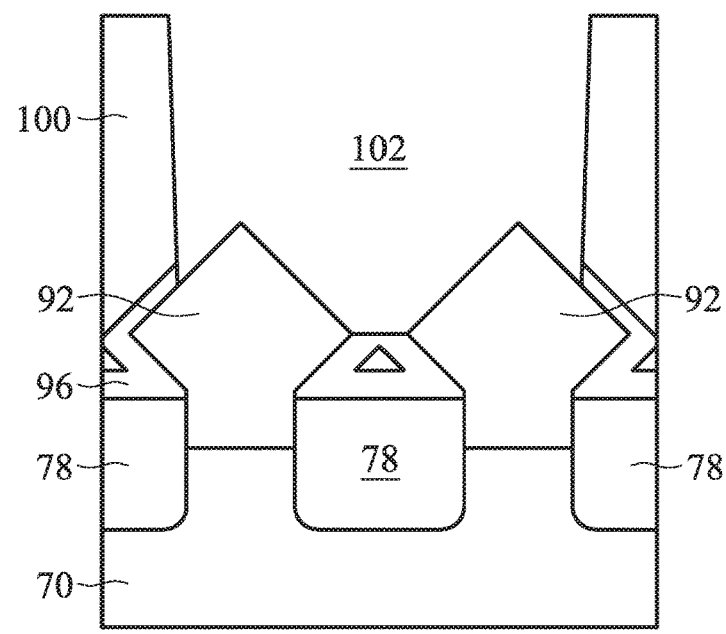

FIGS. 11A and 11B illustrate the formation of openings 102 through the first ILD 100 and the CESL 96 to the epitaxy source/drain regions 92 to expose at least portions of the epitaxy source/drain regions 92, as an example. The first ILD 100 and the CESL 96 may be patterned with the openings 102, for example, using photolithography and one or more etch processes.

As shown in FIG. 11A, in some examples, the openings 102 may have a bottom dimension (D2) of less than 14 nm and a top dimension (D1) less than 17 nm. The depth of the openings 102 may be less than 60 nm. The aspect ratio of the openings 102 (e.g., depth versus top dimension) may be less than 3.

According to some aspects, conductive features can be formed in the openings 102 on the source/drain regions 92. The conductive feature may be referred to as a contact, plug, contact plug, etc. Formation of the contact plug may include formation of conductive material, a barrier layer, an adhesion layer, silicide regions, etc. Some aspects, described in more detail below, provide a process and structure for forming a contact plug. The process may include forming a continuous TiN layer for a Co plug. The process may involve performing a nitride plasma pretreatment and ALD TiN deposition.

Figure 12A:
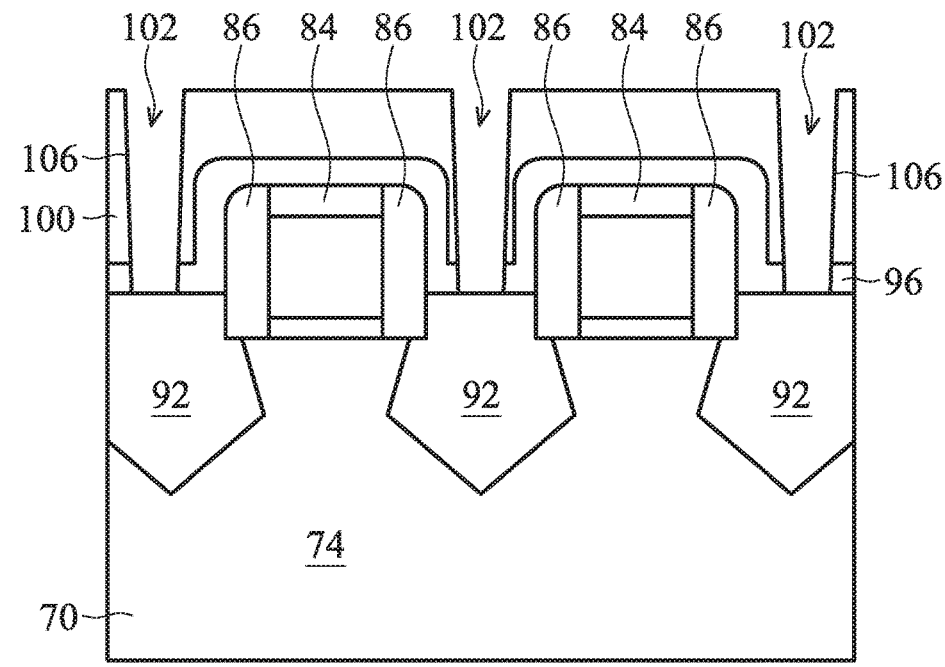
Figure 12B:
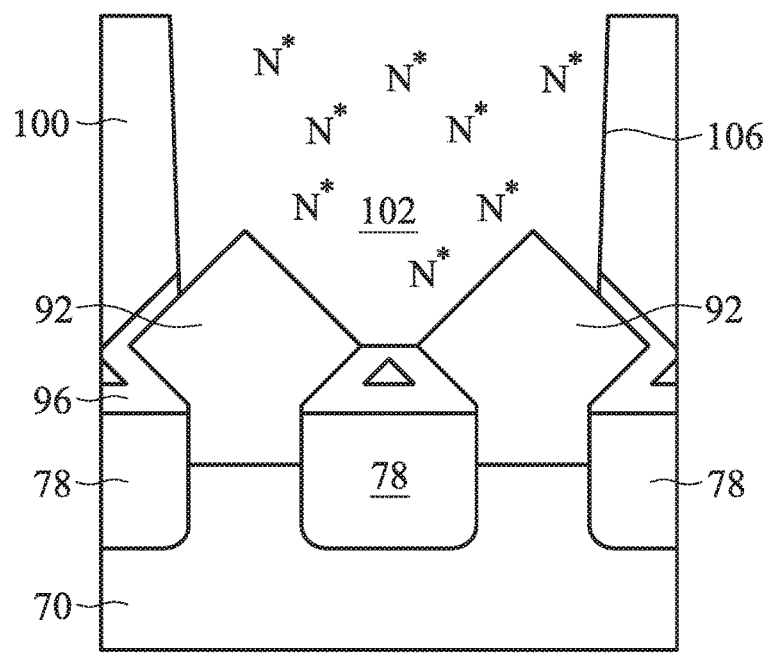

FIGS. 12A and 12B illustrate an example Nitrogen pretreatment of the first ILD 100 and epitaxy source/drain regions 92 for subsequently forming an adhesion layer of a continuous metal nitride layer (e.g., TiN). According to some aspects, before performing the ALD process to deposit the metal nitride layer, the side and bottom surfaces of the openings 102 are pre-treated with a treatment gas. In some examples, a nitride plasma pretreatment can be performed. The pretreatment may replace damage to even out the surfaces in the openings 102. The pretreatment process may "clean" the surfaces in the opening 102, for example, by removing oxide. In some examples, the pretreatment gas may be or include Helium, Argon, or another suitable gas. The pretreatment may form a Nitrogen pretreated region 106. In some examples, the depth/thickness of radicals of the pretreatment (e.g., Nitrogen radicals) penetrating the surfaces of the openings 102, forming the Nitrogen pretreated region 106, may be in a range from about 1 angstrom to about 50 angstroms below the bottom and/or beyond the sidewalls of the openings 110. The pretreatment may be isotropic. The pretreatment may be a remote plasma treatment. In some examples, a remote plasma power in the range from about 1000 W to about 4000 W may be used for the pretreatment. In some examples, the treatment duration may be in a range from about 60 seconds to about 150 seconds. In some examples, the pressure for the treatment may be in the rage from about 0.1 Torr to about 1 Torr. In some examples, the treatment gas flow may be in a range from about 1000 to about 3000 sccm.

The Nitrogen pretreatment incorporates Nitrogen into the sidewalls of the openings 102, which includes the first ILD 100 (e.g., a dielectric including a silicon oxide), and into the bottom surface of the openings 102, which includes the epitaxy source/drain region 92. Thus, when TiN ALD is performed, since the substrate 70 and the continuous TiN layer 108 both have Nitrogen elements, the Nitrogen treated into the substrate helps bridge to the Nitrogen in the ALD TiN, thus serving as a strong adhesion layer. In this case, the TiN layer can adhere better to the first ILD 100 side surfaces and the bottom surface in the opening 102, forming a more continuous TiN layer.

Figure 13A:
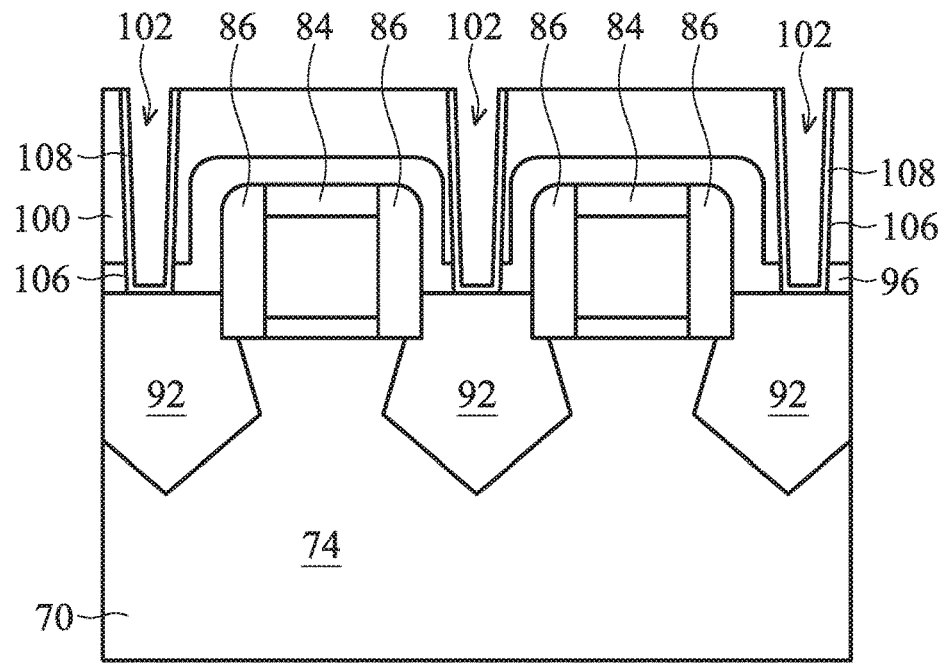
Figure 13B:
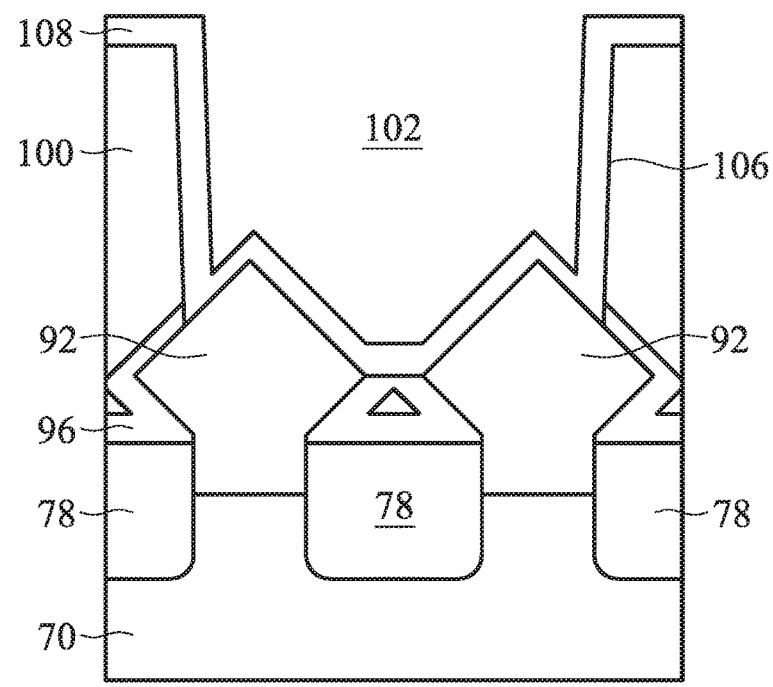

FIGS. 13A and 13B illustrate the formation of the continuous metal nitride layer, such as a TiN layer 108, on the pretreated regions 106 in the openings 102. The continuous TiN layer 108 may be formed on the pretreated regions 106 using an ALD process according to the techniques provided herein to ensure that the metal nitride layer 108 is conformally and continuously deposited to reduce voids causing defects in the contact plug when the contact fill is performed. In some instances, a metal, such as titanium, formed on the epitaxy source/drain region 92 in the opening 102 during the ALD process can react with the epitaxy source/drain region 92 to form a silicide region, such as titanium silicide (TiSi) on the epitaxy source/drain region 92.

The continuous TiN layer 108 can be formed using ALD techniques. The TiN ALD process may include multiple "cycles". Each cycle includes a Ti film deposition and nitrogen treatment to form the TiN layer 108. For example, each cycle may deposit 2 to 5 angstroms TiN film in the openings 110. Thus, after 3-15 cycles, the TiN layer 108 may be in a range from about 15 angstroms to about 20 angstroms in thickness. The ALD process includes using a precursor to deposit a titanium monolayer. In some examples, a tetrakis (dimethylamino) titanium (TDMAT) precursor may be used to form the titanium monolayer. In some instances, the titanium monolayer can react with the epitaxy source/drain region 92 to form a silicide region, such as titanium silicide (TiSi), on the epitaxy source/drain region 92. The titanium monolayer, such as along the side surfaces of the openings 102 and/or on the epitaxy source/drain region 92, may be treated with nitrogen (e.g., nitride) to form titanium nitride. The nitrogen treatment may be performed using the remote plasma treatment described above.

In some examples, a remote plasma power in a range from about 1000 W to about 4000 W may be used. In some examples, the ratio of nitrogen treatment time and Ti deposition time may be in a range from about 0.3 to about 1.5. In some examples, the pressure in the ALD processing chamber during the deposition may be in a range from about 3 Torr to about 6 Torr, and a backside pressure on the substrate 70 may be in a range from about 0.2 Torr to about 2 Torr. In some examples, the continuous TiN layer 108 may have a step coverage (e.g., thickness of the TiN layer 108 on the sidewalls in the openings 102 versus thickness of the TiN layer 108 on a top surface) in a range from about 0.7 to about 1.

Figure 14A:
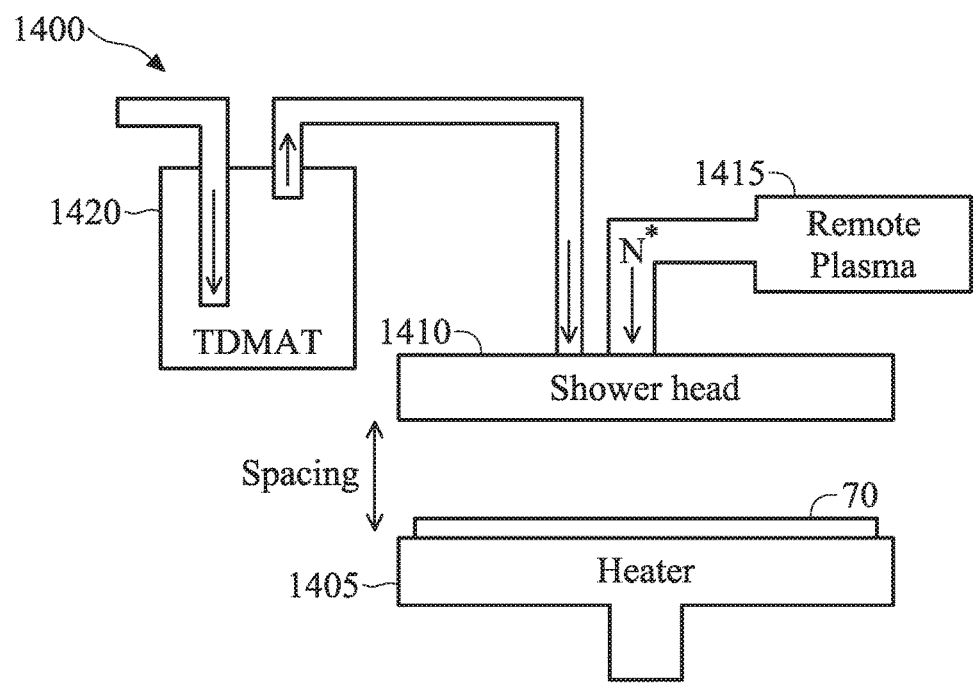
FIG. 14A is an example system for forming the pretreated regions and TiN layer in the contact hole in intermediate stages in the example process of forming one or more FinFETs in accordance with some embodiments.

FIG. 14A is an example system 1400 for performing the pretreatment process to form the treated regions 106 and for performing the TiN ALD process to form the continuous TiN layer 108. As shown in FIG. 14A, the system 1400 includes a heater 1405, shower head 1410, remote plasma source 1415 and gas source 1420. The substrate 70 may be supported by the upper surface of the heater 1405. There may be a spacing between the heater 1405 and the shower head 1410. In some examples, the spacing may be in a range from 250 to 450 mil. The remote plasma 1415 may be used to flow the isotropic nitrogen plasma to treat the surfaces on the substrate 70 for the pretreatment and/or the continuous TiN layer 108 deposition. The deposition module 1420 may be used to perform the deposition. In some examples, the gas source 1420 may flow the precursor (e.g., the TDMAT) to form the titanium monolayer for the continuous TiN layer 108. In some examples, the gas source 1420 may use a helium carrier gas to deliver the precursor. The He gas flow may be in a range from 300-900 sccm. In some examples, the precursor is Ti[N(CH$_3$)$_2$]$_4$. The precursor may be purged at the end of each cycle. At the end of the ALD, the ALD chamber may be pumped down to base pressure.

Figure 14B:
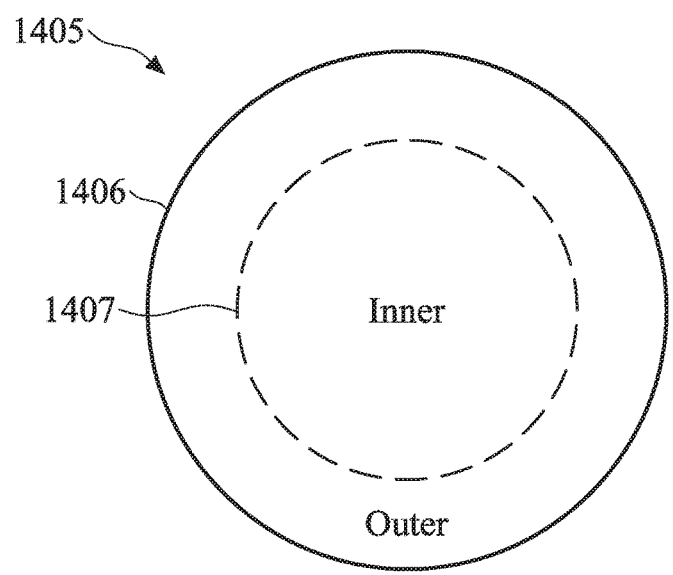
FIG. 14B is an example dual-zone heater used in the system shown in FIG. 14A in accordance with some embodiments.

According to some aspects, the heater 1405 may be used during the pretreatment and/or TiN ALD process. As shown in FIG. 14B, the heater 1405 may be a dual-zone heater having the outer-zone 1406 and inner-zone 1407. A power ratio of the outer-zone 1406 and inner-zone 1407 may be in a range from about 0.7 to about 1. The outer-zone 1406 and inner-zone 1407 may be separately controllable. In some examples, the heater 1405 may be at a temperature in a range from about 300 degrees C. to about 380 degrees C. during the pretreatment and/or TiN ALD process. The heater 1405 may be used to control the thickness and step coverage for the TiN layer 108. For example, higher temperatures may be used to increase the deposition rate and lower temperatures may be used to decrease the deposition rates. In some examples, the heat up time for the substrate 70 may be around 15 seconds or more. The heat up may be performed before, and not as part of, the ALD cycle. According to some aspects, different ranges of treatment power, pressure, flows, etc., may be used for different aspects ratios.

Figure 15A:
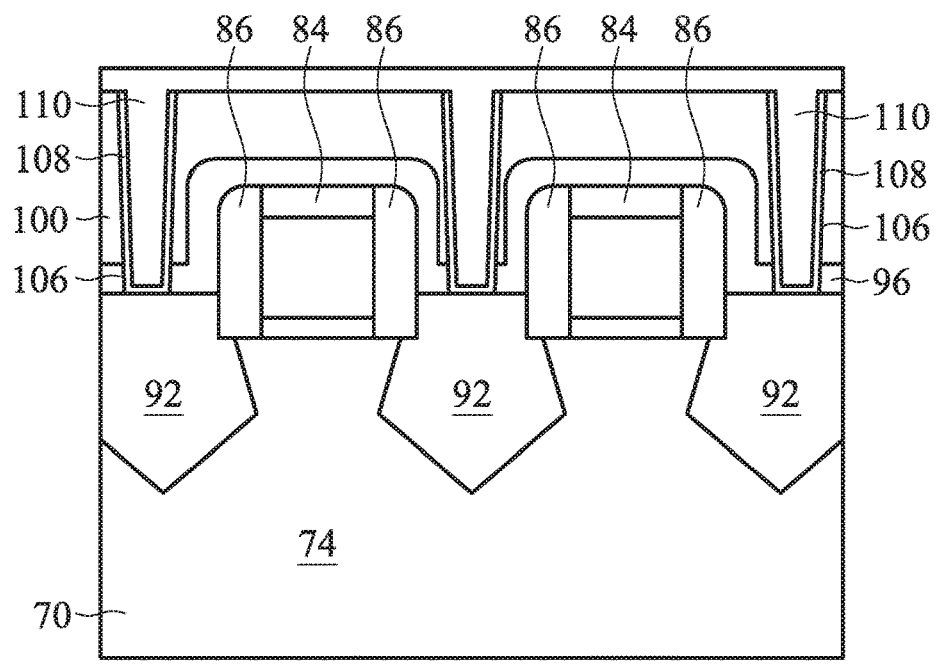
FIGS. 15A-B, 16A-B, and 17A-B are cross-sectional views are cross-sectional views of intermediate stages in the example process of forming one or more FinFETs in accordance with some embodiments.
Figure 15B:
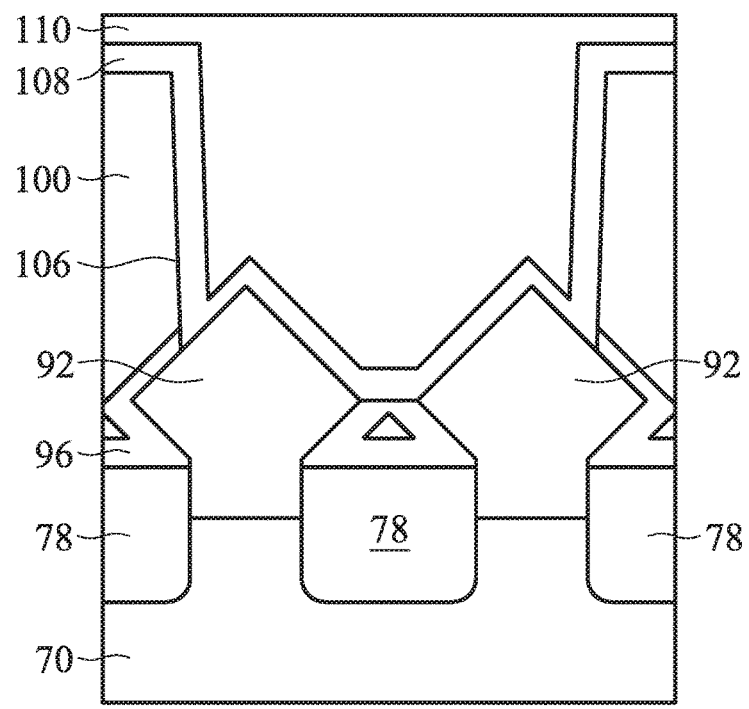

FIGS. 15A and 15B illustrate the formation of conductive material 110 filling the openings 102. The conductive material 110 can be deposited on the continuous TiN layer 108 and fill the openings 102. The conductive material 110 may be cobalt or other suitable substance such as tungsten, copper, aluminum, gold, silver, alloys thereof, the like, or a combination thereof, and may be deposited by CVD, ALD, PVD, a combination of PVD and CVD, or another deposition technique. In some examples, the conductive material 110 may have a top dimension to bottom dimension ratio in the range from about 0.78 to about 0.88. In some examples, PVD may be used for deposition of the conductive material 110 up to a first depth (e.g., about 70 angstroms to about 100 angstroms) and CVD may be used for deposition on the sidewalls and to fill the rest of the openings 102 (e.g., up to about 180 angstroms).

According to some aspects, after the conductive material 110 is deposited, an annealing process may be performed, for example, a rapid thermal annealing (RTA) anneal.

Figure 16A:
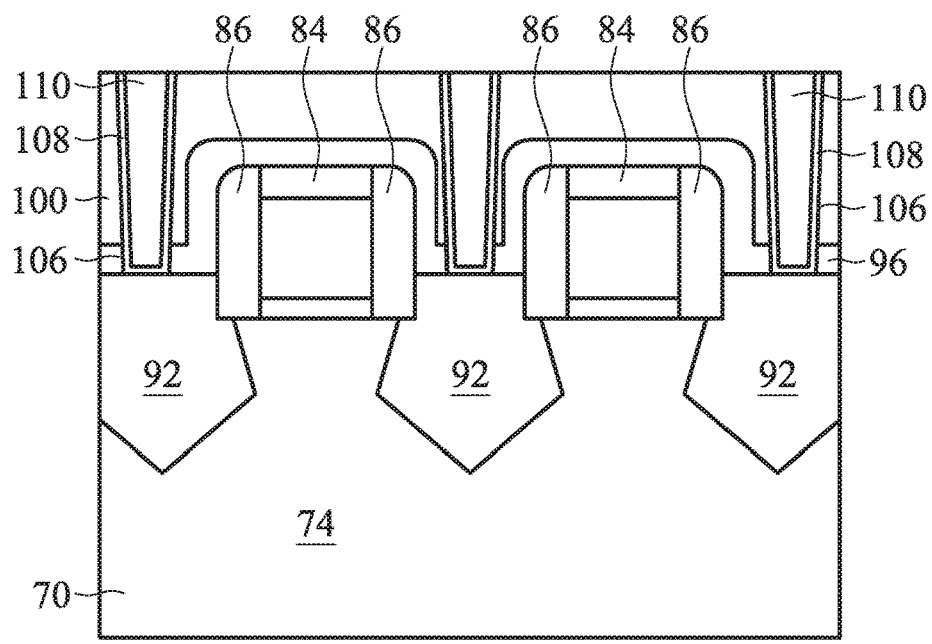
Figure 16B:
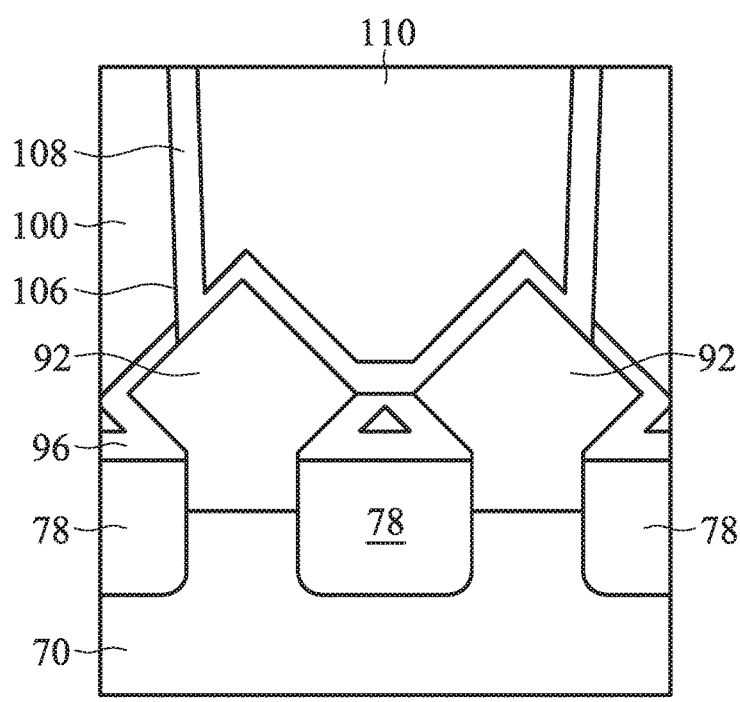

FIGS. 16A and 16B illustrate a CMP process performed on the conductive material 110. After the annealing, excess material may be removed by using a planarization process, such as a CMP, for example. The planarization process may remove excess conductive material 110, TiN layer 108, and/or pretreated region 106 from above the top surface of the first ILD 100. Hence, top surfaces of the conductive material 110, TiN layer 108, pretreated region 106, and/or the first ILD 100 may be coplanar.

Accordingly, conductive features including the conductive material 110, continuous TiN layer 108, and/or silicide regions (e.g., TiSi) may be formed to the epitaxy source/drain regions 92. The conductive features that include the conductive material 110, continuous TiN layer 108, and/or silicide regions may be referred to as contacts, plugs, contact plugs, etc.

Although the conductive features are depicted as having a certain configuration in the figures, the conductive features can have any configuration. For example, separate conductive features may be formed to separate epitaxy source/drain regions 92. A person having ordinary skill in the art will readily understand modifications to process steps described herein to achieve different configurations.

Figure 16C:
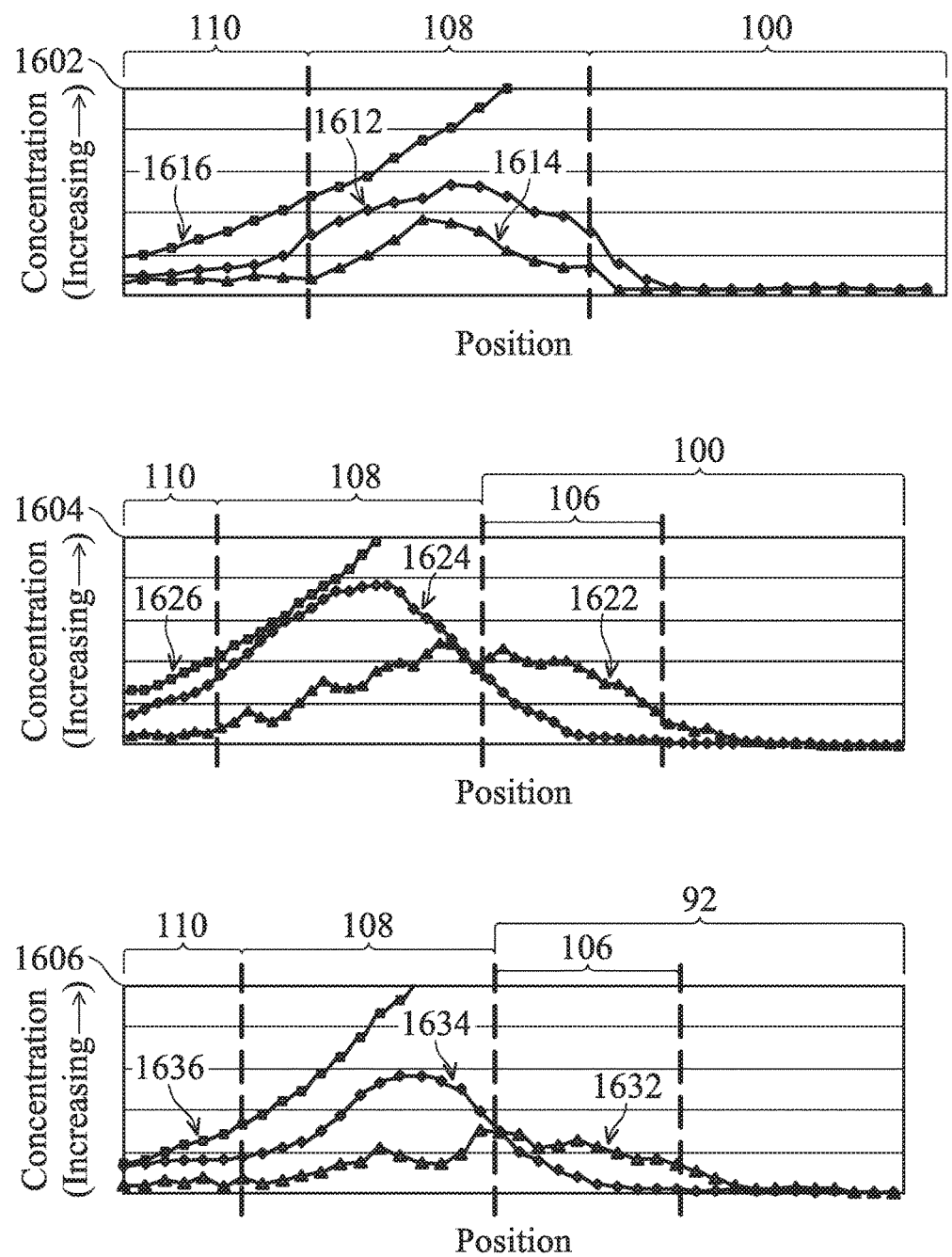
FIG. 16C is graphs showing concentrations of elements in a different structures in accordance with some embodiments.

As shown in FIG. 16A, the nitrogen pretreatment results in a pretreated region 106 having a concentration of nitrogen beneath or abutting the TiN layer 108. If the pretreatment process were not performed, the pretreated region 106 would not be present and there might not be a concentration of nitrogen beneath the TiN layer 108. FIG. 16C illustrates a first graph 1602 showing concentration profiles when the pretreatment process is not performed, a second graph 1604 showing concentration profiles at a sidewall of a conductive feature when a pretreatment process is performed, and a third graph 1606 showing concentrations at a bottom of the conductive feature when a pretreatment process is performed. The graphs 1602, 1604, 1606 illustrate the concentrations at various positions within the structure of FIG. 16A or a similar structure except formed without the pretreatment process.

The first graph 1602 shows a first concentration profile 1612 of nitrogen at various positions in a structure similar to the structure of FIG. 16A, in the case of no nitrogen pretreatment performed. The first graph 1602 further shows a second concentration profile 1614 of titanium and a third concentration profile 1616 of silicon, each being at various positions in the structure. As shown in the graph 1602, at the positions corresponding to the TiN layer 108, there is a concentration of nitrogen present; however, in the positions in the ILD 100, an insignificant concentration of nitrogen or no nitrogen may be present because of diffusion of nitrogen from the TiN layer 108 and because the nitrogen pretreatment was not performed.

The second graph 1604 shows a first concentration profile 1622 of nitrogen at various positions at a sidewall of a conductive feature in the structure of FIG. 16A in the case of a nitrogen pretreatment being performed. The second graph 1604 further shows a second concentration profile 1624 of titanium and a third concentration profile 1626 of silicon, each being at various positions in the structure. The third graph 1606 shows a first concentration profile 1632 of nitrogen at various positions at a bottom of the conductive feature in the structure of FIG. 16A in the case of a nitrogen pretreatment being performed. The third graph 1606 further shows a second concentration profile 1634 of titanium and a third concentration profile 1636 of silicon, each being at various positions in the structure.

As shown in the second graph 1604, when the nitrogen pretreatment process is performed, a greater concentration of nitrogen in the first concentration profile 1622 is formed in the ILD 100 (e.g., in the pretreated region 106) along the sidewalls of the ILD 100 relative to the first concentration profile 1612 in the first graph 1602 at a corresponding position. As shown in the third graph 1606, when the nitrogen pretreatment process is performed, a concentration of nitrogen in the first concentration profile 1632 is formed in the epitaxy source/drain region 92 (e.g., in the pretreated region 106) along the bottom surface in of the conductive feature along the epitaxy source/drain region 92 beneath the TiN layer 108. The pretreated region 106 in the second and third graphs 1604, 1606 may have a depth or thickness in a range from about 1 Angstrom to about 50 Angstroms.

Figure 17A:
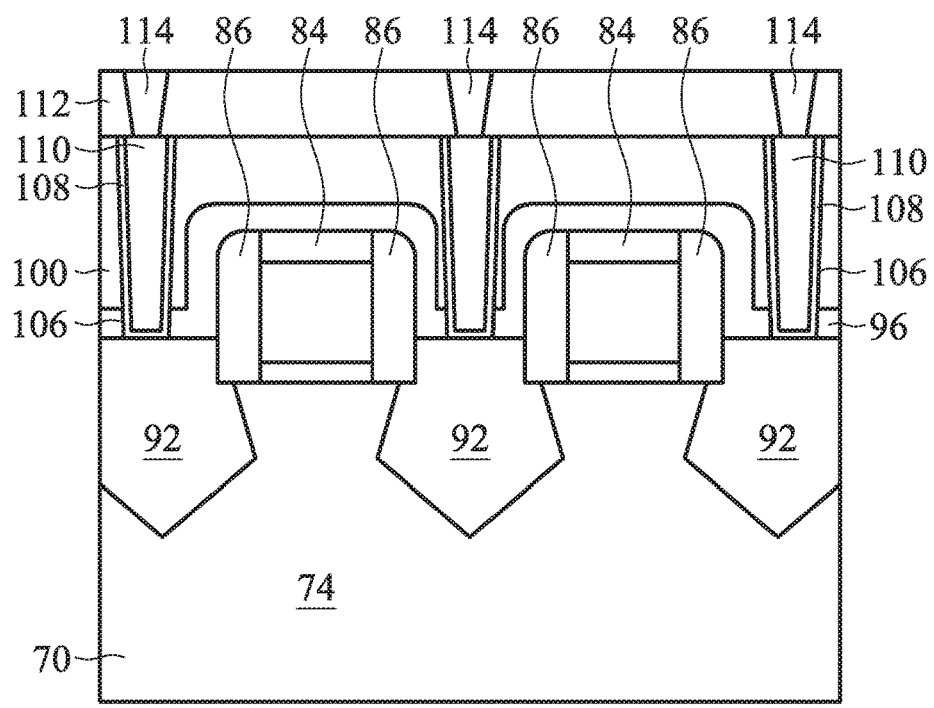
Figure 17B:
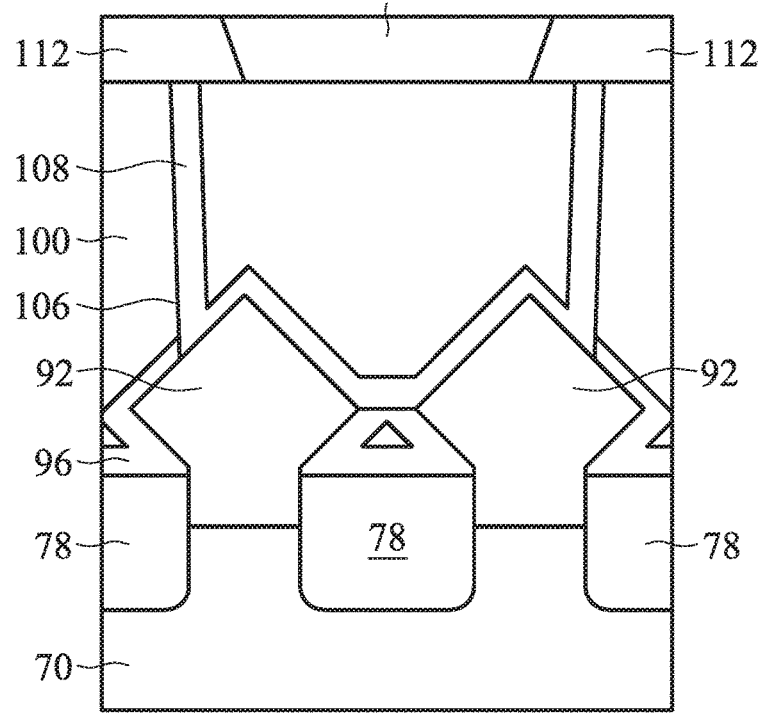

FIGS. 17A and 17B illustrate the formation of one or more dielectric layers 112 and conductive features 114 in the one or more dielectric layers 112. The one or more dielectric layers 112 may include an etch stop layer (ESL) and an ILD or intermetal dielectric (IMD), for example. The ESL may be deposited over the one or the ILD 100, conductive material 110, TiN layer 108, pretreated region 106, etc., and the ILD or IMD may be deposited over the ESL. The ESL may comprise or be silicon nitride, silicon carbon nitride, silicon carbon oxide, carbon nitride, the like, or a combination thereof, and may be deposited by CVD, PECVD, ALD, or another deposition technique. The ILD or IMD may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IDL or IMD may be deposited by spin-on, CVD, FCVD, PECVD, PVD, or another deposition technique.

Recesses and/or openings are formed in and/or through the one or more dielectric layers 112 where the conductive features 114 are to be formed. The one or more dielectric layers 112 may be patterned with the recesses and/or openings, for example, using photolithography and one or more etch processes. The conductive features 114 may then be formed in the recesses and/or openings. The conductive features 114 may include a barrier layer and conductive material formed on the barrier layer, for example. The barrier layer can be conformally deposited in the recesses and/or openings and over the one or more dielectric layers 112. The barrier layer may be or comprise titanium nitride, titanium oxide, tantalum nitride, tantalum oxide, the like, or a combination thereof, and may be deposited by ALD, CVD, or another deposition technique. The conductive material may be or comprise tungsten, copper, aluminum, gold, silver, alloys thereof, the like, or a combination thereof, and may be deposited by CVD, ALD, PVD, or another deposition technique. After the material of the conductive features 114 is deposited, excess material may be removed by using a planarization process, such as a CMP, for example. The planarization process may remove excess material of the conductive features 114 from above a top surface of the one or more dielectric layers 112. Hence, top surfaces of the conductive features 114 and the one or more dielectric layers 112 may be coplanar. The conductive features 114 may be or may be referred to as contacts, vias, conductive lines, etc.

FIGS. 18A-B through 21A-B are cross-sectional views of respective intermediate structures at intermediate stages in another example process of forming a semiconductor device in accordance with some embodiments. FIGS. 18A-B through 21A-B illustrate further aspects of a replacement gate process as described herein. Processing is first performed as described above with respect FIGS. 2A-B through 10A-B.

Figure 18A:
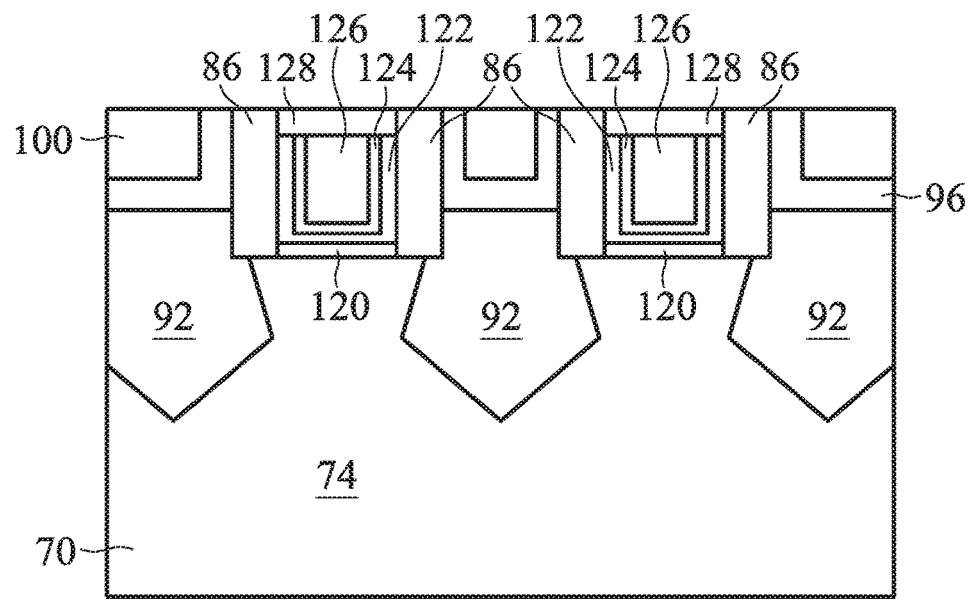
FIGS. 18A-B, 19A-B, 20A-B, and 21A-B are cross-sectional views of respective intermediate structures at intermediate stages in another example process of forming a semiconductor device in accordance with some embodiments.
Figure 18B:
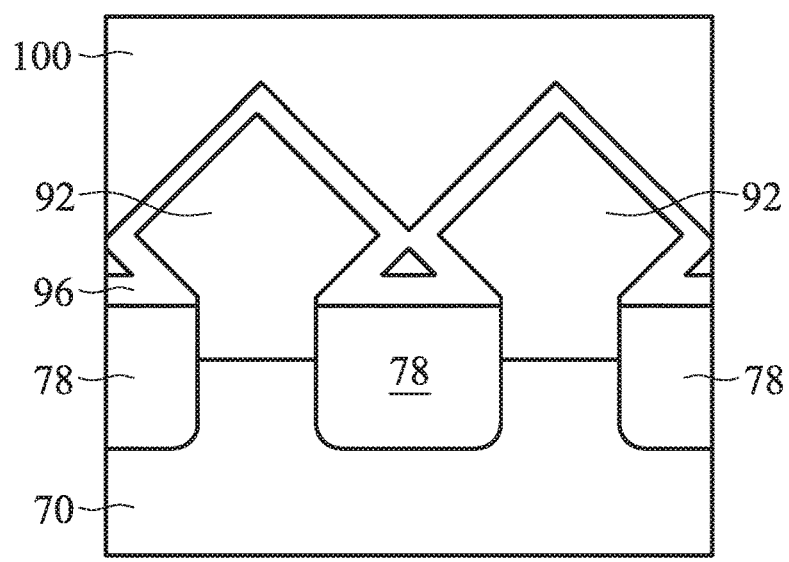

FIGS. 18A and 18B illustrate the replacement of gate stacks with replacement gate structures. The first ILD 100 and CESL 96 are formed with top surfaces coplanar with top surfaces of the gate layers 82. A planarization process, such as a CMP, may be performed to level the top surface of the first ILD 100 and CESL 96 with the top surfaces of the gate layers 82. The CMP may also remove the masks 84 (and, in some instances, upper portions of the gate spacers 86) on the gate layers 82. Accordingly, top surfaces of the gate layers 82 are exposed through the first ILD 100 and the CESL 96.

With the gate layers 82 exposed through the first ILD 100 and the CESL 96, the gate layers 82 are removed, such as by one or more etch processes. The gate layers 82 may be removed by an etch process selective to the gate layers 82, wherein the dielectric layers 80 act as etch stop layers, and subsequently, the dielectric layers 80 can optionally be removed by a different etch process selective to the dielectric layers 80. The etch processes can be, for example, a RIE, NBE, a wet etch, or another etch process. Recesses are formed between gate spacers 86 where the gate stacks are removed, and channel regions of the fins 74 are exposed through the recesses.

The replacement gate structures are formed in the recesses formed where the gate stacks were removed. The replacement gate structures each include, as illustrated, an interfacial dielectric 120, a gate dielectric layer 122, one or more optional conformal layers 124, and a gate electrode 126. The interfacial dielectric 120 is formed on sidewalls and top surfaces of the fins 74 along the channel regions. The interfacial dielectric 120 can be, for example, the dielectric layer 80 if not removed, an oxide (e.g., silicon oxide) formed by thermal or chemical oxidation of the fin 74, and/or an oxide (e.g., silicon oxide), nitride (e.g., silicon nitride), and/or another dielectric layer formed by CVD, ALD, MBD, or another deposition technique.

The gate dielectric layer 122 can be conformally deposited in the recesses where gate stacks were removed (e.g., on top surfaces of the isolation regions 78, on the interfacial dielectric 120, and sidewalls of the gate spacers 86) and on the top surfaces of the first ILD 100, the CESL 96, and gate spacers 86. The gate dielectric layer 122 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 122 can be deposited by ALD, PECVD, MBD, or another deposition technique.

The one or more optional conformal layers 124 can include one or more barrier and/or capping layers and one or more work-function tuning layers. The one or more barrier and/or capping layers can include tantalum nitride, titanium nitride, the like, or a combination thereof, and may be deposited by ALD, PECVD, MBD, or another deposition technique. The one or more work-function tuning layer may include or be aluminum titanium carbide, aluminum titanium oxide, aluminum titanium nitride, the like, or a combination thereof, and may be deposited by ALD, PECVD, MBD, or another deposition technique. In some examples, a capping layer (e.g., a TiN layer) is formed conformally on the gate dielectric layer 122; a first barrier layer (e.g., a TaN layer) is formed conformally on the capping layer; one or more work-function tuning layers are sequentially formed conformally on the first barrier layer; and a second barrier layer (e.g., a TiN layer) is formed on the one or more work-function tuning layers.

A layer for the gate electrodes 126 is formed over the one or more conformal layers 124, if implemented, and/or the gate dielectric layer 122. The layer for the gate electrodes 126 can fill remaining recesses where the gate stacks were removed. The layer for the gate electrodes 126 may be or comprise a metal-containing material such as tungsten, cobalt, aluminum, ruthenium, copper, multi-layers thereof, a combination thereof, or the like. The layer for the gate electrodes 126 can be deposited by ALD, PECVD, MBD, PVD, or another deposition technique. Portions of the layer for the gate electrodes 126, one or more conformal layers 124, and gate dielectric layer 122 above the top surfaces of the first ILD 100, the CESL 96, and gate spacers 86 are removed. For example, a planarization process, like a CMP, may remove the portions of the layer for the gate electrodes 126, one or more conformal layers 124, and gate dielectric layer 122 above the top surfaces of the first ILD 100, the CESL 96, and gate spacers 86. Subsequently, an etch-back may recess top surfaces of the gate electrodes 126, one or more conformal layers 124, and gate dielectric layer 122 to a level below the top surfaces of the first ILD 100, the CESL 96, and gate spacers 86. The etch-back may be a RIE, wet etch, or another etch process, for example. The replacement gate structures comprising the gate electrodes 126, one or more conformal layers 124, gate dielectric layer 122, and interfacial dielectric 120 may therefore be formed as illustrated in FIG. 12A.

A layer for masks 128 is formed over the gate electrodes 126, one or more conformal layers 124, and gate dielectric layer 122 (e.g., where the gate electrodes 126, one or more conformal layers 124, and gate dielectric layer 122 have been etched back) and over the first ILD 100, the CESL 96, and gate spacers 86. The layer for the masks 128 may include or be silicon oxynitride, silicon nitride, silicon carbide, silicon carbon nitride, the like, or a combination thereof, and may be deposited by CVD, PVD, ALD, or another deposition technique. Portions of the layer for the masks 128 above the top surfaces of the first ILD 100, the CESL 96, and gate spacers 86 are removed. For example, a planarization process, like a CMP, may remove the portions of the layer for masks 128 above the top surfaces of the first ILD 100, the CESL 96, and gate spacers 86, and the top surfaces of the masks 128 may be formed coplanar with the top surfaces of the first ILD 100, the CESL 96, and gate spacers 86.

Figure 19A:
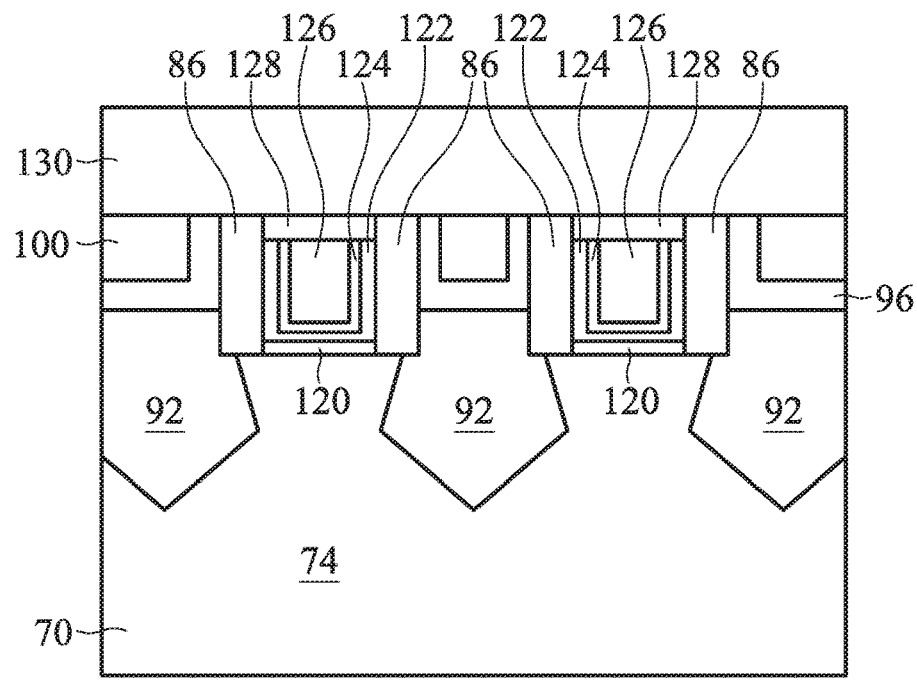
Figure 19B:
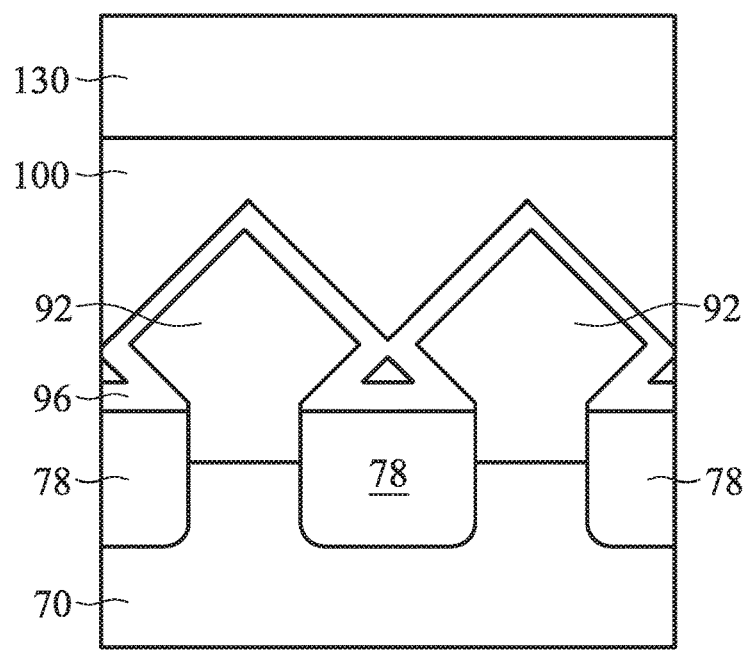

FIGS. 19A and 19B illustrate the formation of a second ILD 130 over the first ILD 100, masks 128, gate spacers 86, and CESL 96. Although not illustrated, in some examples, an etch stop layer may be deposited over the first ILD 100, etc., and the second ILD 130 may be deposited over the ESL. If implemented, the etch stop layer may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

Figure 20A:
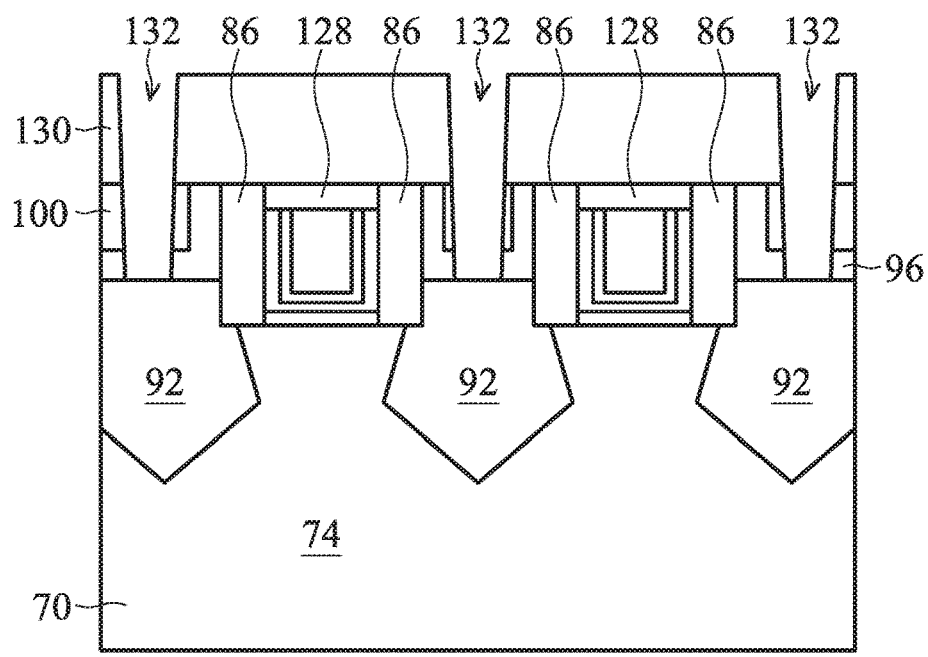
Figure 20B:
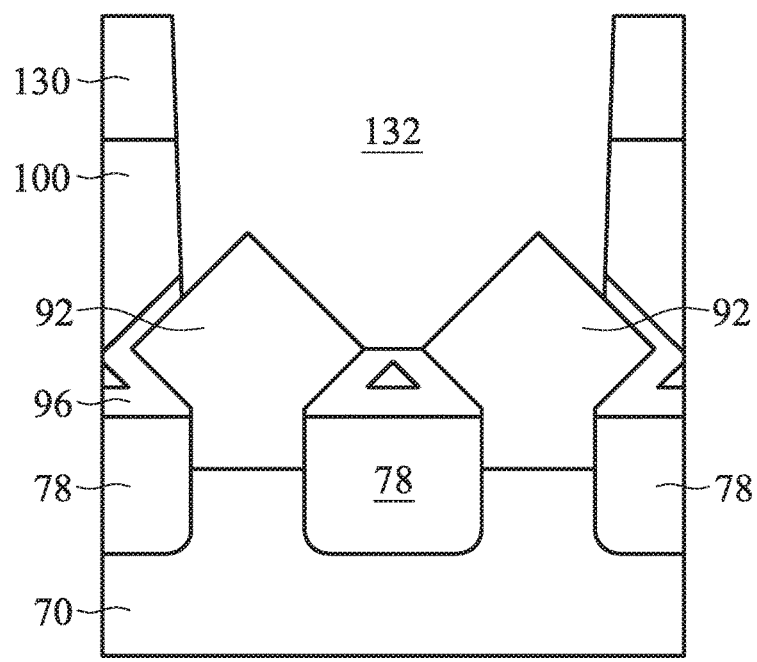

FIGS. 20A and 20B illustrate the formation of openings 132 through the second ILD 130, the first ILD 100, and the CESL 96 to the epitaxy source/drain regions 92 to expose at least portions of the epitaxy source/drain regions 92, as an example. The second ILD 130, the first ILD 100, and the CESL 96 may be patterned with the openings 132, for example, using photolithography and one or more etch processes.

Figure 21A:
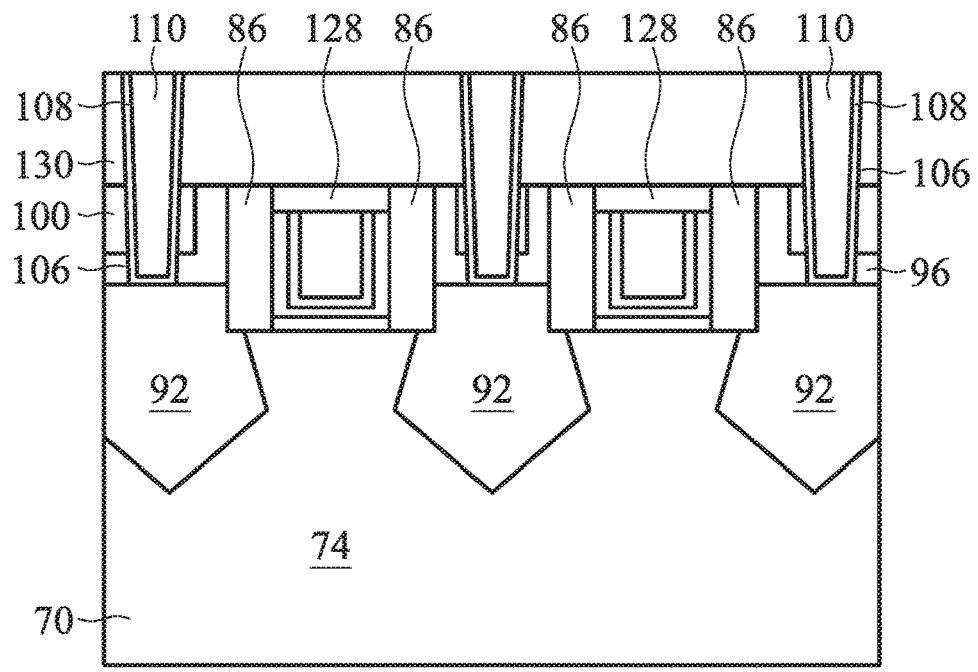
Figure 21B:
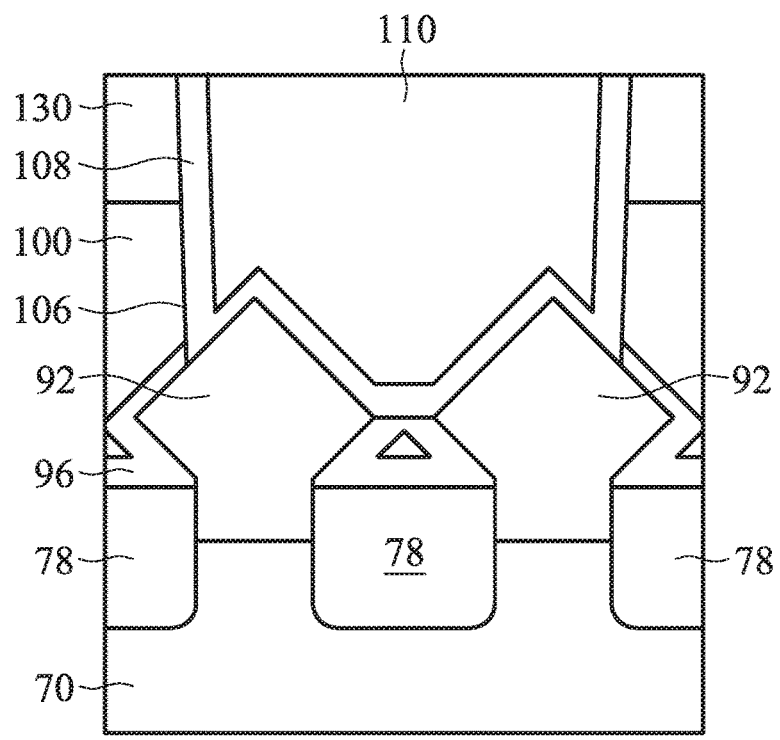

FIGS. 21A and 21B illustrate the formation of conductive features in the openings 132 to the epitaxy source/drain regions 92. Each conductive feature, as illustrated, includes a treated region 106, a metal nitride layer 108 (e.g., TiN) on the treated region 106, and conductive material 110 (e.g., Cobalt) on the metal nitride 108, filling the openings 132. In some examples, each conductive feature may further include a silicide region on the epitaxy source/drain region 92.

Aspects of the disclosure may provide advantages. The techniques described herein for a continuous TiN barrier layer for forming a contact plug may improve performance of semiconductor devices, such as reducing voids and improved gap fill ability for high aspect ratio holes.

In an embodiment, a method is provided. The method generally includes forming an opening through a dielectric layer to an active area on a substrate. The method includes performing a first plasma treatment along a sidewall of the opening. The method includes performing an atomic layer deposition (ALD) process to form a metal nitride layer along the sidewall of the opening. The ALD process includes a plurality of cycles. Each cycle includes flowing a precursor to form a metal monolayer along the sidewall and performing a second plasma treatment to treat the metal monolayer with nitrogen. The method includes depositing a conductive material on the metal nitride layer in the opening to form a conductive feature.

In another embodiment, a structure is provided. The structure generally includes an active region on a substrate. The active region includes a source/drain region. The structure includes an interlayer dielectric (ILD) over the active region. The structure includes a nitrogen treated region along a sidewall of the ILD. The sidewall extends to the active region. The structure includes a metal nitride layer along the nitrogen treated region. The structure includes a conductive material formed on the metal nitride layer.

In another embodiment, another method is provided. The method generally includes forming a fin on a substrate. The method includes forming a gate structure over the fin. The method includes forming a dielectric layer over the fin. The method includes forming an opening through the dielectric layer to a source/drain region of the fin proximate the gate structure. The method includes forming a conductive feature in the opening. Forming the conductive feature includes performing a first plasma treatment along the side surfaces of the opening. Forming the conductive feature includes forming an adhesion layer along the treated side surfaces.

The adhesion layer is formed by an atomic layer deposition (ALD) process including a plurality of cycles. Each cycle includes flowing a precursor to form a metal monolayer along the treated side surfaces and performing a second plasma treatment to treat the metal monolayer with nitrogen. Forming the conductive feature includes filling the opening with a conductive material deposited on the adhesion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an opening through a dielectric layer to a semiconductor active area on a substrate;
   performing a first plasma treatment along a sidewall and a bottom of the opening, wherein the first plasma treatment forms a nitrogen-containing layer in the sidewall and the bottom of the opening;
   performing an atomic layer deposition (ALD) process to form a metal nitride layer along the sidewall and the bottom of the opening, the metal nitride layer having a first nitrogen concentration located at an interface with the nitrogen-containing layer and a second nitrogen concentration opposite the interface, the first nitrogen concentration being greater than the second nitrogen concentration, wherein the ALD process comprises a plurality of cycles, each cycle including:
      flowing a precursor to form a first monolayer along the sidewall; and
      performing a second plasma treatment to treat the first monolayer with nitrogen radicals, wherein the nitrogen radicals react with the first monolayer to form the metal nitride layer on the nitrogen-containing layer on the sidewall and the bottom of the opening; and
   depositing a conductive material on the metal nitride layer in the opening to form a conductive feature.

2. The method of claim 1, wherein the dielectric layer comprises an interlayer dielectric (ILD), and wherein the opening is formed to a source/drain region of the semiconductor active area.

3. The method of claim 1 further comprising forming a silicide region on a source/drain region of the semiconductor active area through the opening, wherein the silicide region comprises a titanium silicon material.

4. The method of claim 1, wherein the opening has an aspect ratio greater than 3.

5. The method of claim 1, further comprising, after depositing the conductive material, performing a rapid thermal anneal (RTA) on the conductive material.

6. The method of claim 1, wherein the conductive material comprises a cobalt material, and wherein the conductive feature comprises a contact plug.

7. The method of claim 1, further comprising:
   heating the substrate, prior to performing the ALD process, using a dual zone heater configured to heat different areas of the substrate at different temperatures; and
   dynamically adjusting the temperatures at the different areas of the substrate during at least one of the ALD or plasma treatment processes.

8. The method of claim 1, wherein the first plasma treatment is isotropic, wherein the first plasma treatment is performed using a remote plasma source, and wherein a gas of the first plasma treatment comprises at least one of: nitrogen, helium, or argon.

9. The method of claim 1, wherein the precursor comprises a tetrakis (dimethylamino) titanium (TDMAT) precursor.

10. A structure comprising:
    an active region on a substrate, the active region comprising a source/drain region, the active region comprising a semiconductor material;
    an interlayer dielectric (ILD) over the active region;
    a nitrogen treated region along opposing sidewalls of the ILD and a surface of the active region, the sidewall extending to the active region, the nitrogen treated region having a first titanium concentration at a first location and a second titanium concentration at a second location, the second location being at the opposing sidewalls of the ILD, the first location being opposite of the second location, the second titanium concentration being greater than the first titanium concentration;
    a metal nitride layer on the nitrogen treated region along the opposing sidewalls of the ILD and the surface of the active region, the metal nitride layer having a first nitrogen concentration at a third location, a second nitrogen concentration at a fourth location, the fourth location being at an interface between the metal nitride layer and the nitrogen treated region, the fourth location being opposite of the third location, the first nitrogen concentration being greater than the second nitrogen concentration, the metal nitride layer having a third titanium concentration at the third location, a fourth titanium concentration in a bulk region interposed between the third location and the fourth location, and a fifth titanium concentration at the fourth location the fourth titanium concentration being greater than each of the third titanium concentration and the fifth titanium concentration; and
    a conductive material on the metal nitride layer.

11. The structure of claim 10, wherein the nitrogen treated region along the opposing sidewalls of the ILD has a thickness in a range from 1 angstrom to 50 angstroms.

12. The structure of claim 10, wherein the conductive material comprises cobalt.

13. The structure of claim 10, wherein the ILD comprises a low-k dielectric material.

14. The structure of claim 10 further comprising a silicide region on the source/drain region of the active region, the opposing sidewalls extending to the silicide region, wherein the silicide region comprises titanium silicon.

15. The structure of claim 10, wherein a width is between the opposing sidewalls of the ILD, the opposing sidewalls having a height, a ratio of the height to the width being greater than 3.

16. A method comprising:
    forming a fin on a substrate;
    forming a gate structure over the fin;

forming a dielectric layer over the fin;
forming an opening through the dielectric layer to a source/drain region of the fin proximate the gate structure; and
forming a conductive feature in the opening, wherein forming the conductive feature comprises:
performing a first plasma treatment along side surfaces and a bottom of the opening to form a nitrogen pretreatment layer; and
forming an adhesion layer on the nitrogen pretreatment layer along the side surfaces and the bottom of the opening, wherein the adhesion layer is formed by an atomic layer deposition (ALD) process comprising a plurality of cycles, each cycle including:
flowing a precursor to form a first monolayer on the nitrogen pretreatment layer along the side surfaces and the bottom of the opening, the first monolayer comprising a monolayer metal; and
performing a second plasma treatment to treat the first monolayer with nitrogen radicals to form a metal nitride layer; and
filling the opening with a conductive material deposited on the adhesion layer;
wherein a first nitrogen region overlaps a boundary between the dielectric layer and the adhesion layer, the first nitrogen region having a first nitrogen concentration gradient and a first titanium concentration gradient extending from the dielectric layer to the adhesion layer, wherein the first nitrogen concentration gradient intersects the first titanium concentration gradient.

17. The method of claim 16, wherein the side surfaces comprise an interlayer dielectric (ILD) material, and wherein the forming the dielectric layer over the fin further comprises forming a void between the source/drain region and an adjacent source/drain region.

18. The method of claim 16, wherein the conductive material comprises a cobalt material, and wherein the conductive feature comprises a contact plug.

19. The method of claim 16, further comprising:
heating the substrate, prior to performing the ALD process, using a dual zone heater configured to heat different areas of the substrate at different temperatures; and
dynamically adjusting the temperatures at the different areas of the substrate during at least one of the ALD or plasma treatment processes.

20. The method of claim 16, wherein the first plasma treatment is isotropic, wherein the first plasma treatment is performed using a remote plasma source, and wherein a gas of the first plasma treatment comprises at least one of: nitrogen, helium, or argon.

* * * * *